(12) United States Patent
Apalkov et al.

(10) Patent No.: US 9,741,927 B2
(45) Date of Patent: Aug. 22, 2017

(54) METHOD AND SYSTEM FOR PROVIDING MAGNETIC JUNCTIONS HAVING A GRADIENT IN MAGNETIC ORDERING TEMPERATURE

(71) Applicant: Samsung Electronics Co., LTD., Gyeonggi-do (KR)

(72) Inventors: Dmytro Apalkov, San Jose, CA (US); Alexey Vasilyevitch Khvalkovskiy, Sunnyvale, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 8 days.

(21) Appl. No.: 14/613,936

(22) Filed: Feb. 4, 2015

(65) Prior Publication Data

US 2015/0295167 A1  Oct. 15, 2015

Related U.S. Application Data

(60) Provisional application No. 61/978,144, filed on Apr. 10, 2014.

(51) Int. Cl.
*H01L 29/82* (2006.01)
*H01L 43/10* (2006.01)
*H01L 43/08* (2006.01)

(52) U.S. Cl.
CPC .............. *H01L 43/10* (2013.01); *H01L 43/08* (2013.01)

(58) Field of Classification Search
CPC ......... H01L 43/08; H01L 43/10; H01L 43/02; H01L 43/12; H01L 21/67709; H01L 29/82

USPC ................ 365/158, 171, 173; 257/421–427, 257/E29.323, E21.002, E27.005, E21.665; 438/3
See application file for complete search history.

(56) References Cited

U.S. PATENT DOCUMENTS

| 5,282,095 | A | 1/1994 | Spruit |
| 5,565,415 | A | 10/1996 | Matsuura |
| 6,704,220 | B2 | 3/2004 | Leuschner |
| 7,602,637 | B2 | 10/2009 | Klostermann |
| 7,679,155 | B2 | 3/2010 | Korenivski |
| 7,929,370 | B2 | 4/2011 | Min |

(Continued)

FOREIGN PATENT DOCUMENTS

| JP | 2013035360 | 3/2013 |
| JP | 2014005158 | 1/2014 |
| JP | 2012017236 | 3/2014 |

*Primary Examiner* — Thao X Le
*Assistant Examiner* — Nduka Ojeh
(74) *Attorney, Agent, or Firm* — Convergent Law Group LLP

(57) ABSTRACT

A method and system for providing a magnetic junction usable in a magnetic device are described. The magnetic junction includes a reference layer, a nonmagnetic spacer layer and a free layer. The nonmagnetic spacer layer is between the reference layer and the free layer. The free layer has a gradient in a magnetic ordering temperature such that a first portion of the free layer has a first magnetic ordering temperature higher than a second magnetic ordering temperature of a second portion of the free layer. The first portion of the free layer is closer to the reference layer than the second portion of the free layer. The magnetic junction is configured such that the free layer is switchable between stable magnetic states when a write current is passed through the magnetic junction.

22 Claims, 8 Drawing Sheets

| Co | 86 |
| Pt | 88 |
| Co | 86 |
| Pt | 88 |
| Co | 86 |
| Pt | 88 |
| Co | 86 |
| Coupling Layer | 84 |
| CoFeB | 82 |
| Nonmagnetic Spacer Layer | 70 |
| Ferromagnetic Layer | 66 |
| Spacer Layer | 64 |
| Ferromagnetic Layer | 62 |

50

80

60

(56) References Cited

U.S. PATENT DOCUMENTS

| | | |
|---|---|---|
| 8,278,123 B2 | 10/2012 | Choi |
| 8,279,661 B2 | 10/2012 | Ogimoto |
| 8,310,866 B2 | 11/2012 | Leuschner |
| 8,431,418 B2 | 4/2013 | Choi |
| 8,456,903 B2 | 6/2013 | Tang |
| 8,466,525 B2 | 6/2013 | Zheng |
| 8,470,462 B2 | 6/2013 | Horng |
| 2003/0221750 A1* | 12/2003 | Pecharsky ............... C22C 28/00 148/121 |
| 2005/0184839 A1* | 8/2005 | Nguyen ................. B82Y 25/00 335/173 |
| 2006/0176735 A1 | 8/2006 | Yuasa |
| 2007/0258170 A1 | 11/2007 | Yuasa |
| 2008/0026253 A1 | 1/2008 | Yuasa |
| 2011/0031569 A1* | 2/2011 | Watts .................... B82Y 25/00 257/421 |
| 2011/0044099 A1 | 2/2011 | Dieny |
| 2011/0140217 A1* | 6/2011 | Nguyen ................. B82Y 25/00 257/421 |
| 2012/0146167 A1* | 6/2012 | Huai ...................... H01L 43/08 257/421 |
| 2012/0155156 A1* | 6/2012 | Watts .................... B82Y 25/00 365/158 |
| 2012/0170357 A1* | 7/2012 | Apalkov ............. G11C 11/5607 365/158 |
| 2012/0250404 A1 | 10/2012 | Wang |
| 2013/0175644 A1 | 7/2013 | Horng |
| 2013/0249026 A1 | 9/2013 | Kitagawa |
| 2014/0063921 A1* | 3/2014 | Tang ...................... G11C 11/16 365/158 |
| 2014/0169082 A1* | 6/2014 | Worledge ............. G11C 11/161 365/158 |
| 2014/0169085 A1* | 6/2014 | Wang ................... G11C 11/161 365/158 |
| 2015/0016237 A1* | 1/2015 | Chen ...................... G11B 5/746 369/13.26 |

* cited by examiner

METHOD AND SYSTEM FOR PROVIDING MAGNETIC JUNCTIONS HAVING A GRADIENT IN MAGNETIC ORDERING TEMPERATURE

CROSS-REFERENCE TO RELATED APPLICATIONS

This application claims the benefit of provisional Patent Application Ser. No. 61/978,144, filed Apr. 10, 2014, entitled IMPROVED THERMAL STACK WITH GRADIENT, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO. Alternatively, a conductive layer may be used instead of the conventional tunneling barrier layer 18.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. For example, mechanisms for improving the performance of STT-RAM are desired. Accordingly, what is needed is a method and system that may improve the performance of the spin transfer torque based memories. The method and system described herein address such a need.

BRIEF SUMMARY OF THE INVENTION

A method and system for providing a magnetic junction usable in an electronic device are described. The magnetic junction includes a reference layer, a nonmagnetic spacer layer, and a free layer. The nonmagnetic spacer layer is between the reference layer and the free layer. The free layer has a gradient in a magnetic ordering temperature such that a first portion of the free layer has a first magnetic ordering temperature higher than a second magnetic ordering temperature of a second portion of the free layer. The first portion of the free layer is closer to the reference layer than the second portion of the free layer. The magnetic junction is configured such that the free layer is switchable between stable magnetic states when a write current is passed through the magnetic junction.

DETAILED DESCRIPTION OF THE INVENTION

Figure 1:
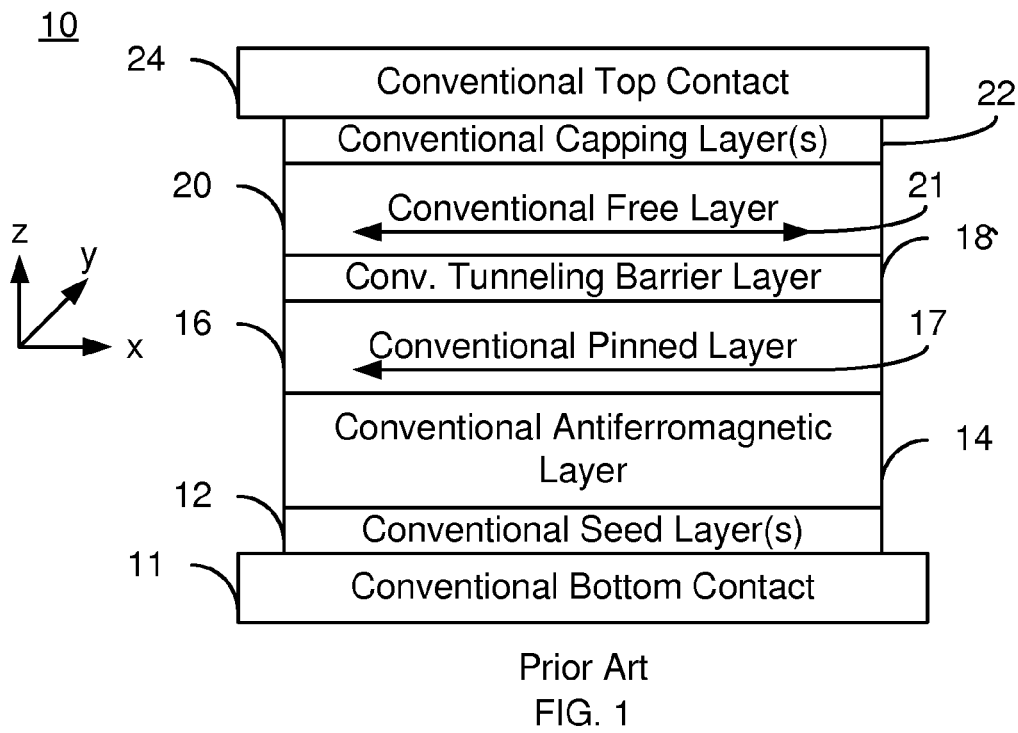
FIG. 1 depicts a conventional magnetic junction.

The exemplary embodiments relate to magnetic junctions usable in electronic devices, such as those using magnetic memories, and other devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments include magnetic junction(s) usable in magnetic device(s). For example, the magnetic junction(s) may be within magnetic storage cells for a magnetic memory programmable using spin transfer torque. The magnetic memories may be usable in electronic devices that make use of nonvolatile storage. Such electronic devices include but are not limited to cellular phones, tablets, and other mobile computing devices. A method and system for providing a magnetic junction usable in an electronic device are described. The magnetic junction includes a reference layer, a nonmagnetic spacer layer, and a free layer. The nonmagnetic spacer layer is between the reference layer and the free layer. The free layer has a gradient in a magnetic ordering temperature such that a first portion of the free layer has a first magnetic ordering temperature higher than a second magnetic ordering temperature of a second portion of the free layer. The first portion of the free layer is closer to the reference layer than the second portion of the free layer. The magnetic junction is configured such that the free layer is switchable between stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
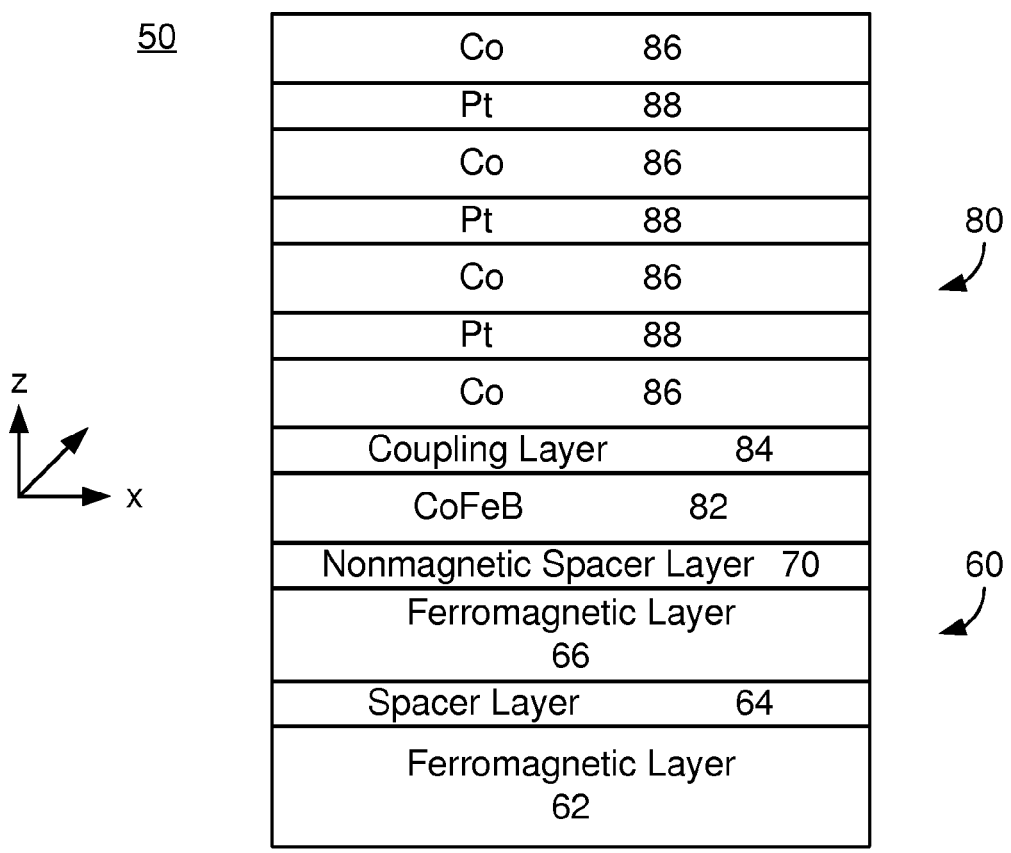
FIG. 2 depicts a more recently developed magnetic junction usable in a magnetic memory programmable using spin transfer torque.

FIG. 2 depicts a more recently developed magnetic junction 50. For clarity, FIG. 2 is not to scale. The magnetic junction 50 includes a reference layer 60, a nonmagnetic spacer layer 70, and a free layer 80. The magnetic junction 50 is also configured to allow the free layer 80 to be switched between stable magnetic states when a write current is passed through the magnetic junction 50. Thus, the free layer 80 is switchable utilizing spin transfer torque.

The reference layer 60 is magnetic and may have its magnetization pinned, or fixed, in a particular direction during at least a portion of the operation of the magnetic junction. The reference layer 60 is a synthetic antiferromagnet (SAF) including magnetic layers 62 and 66 antiferromagnetically coupled through a thin nonmagnetic layer 64, such as Ru. The spacer layer 70 is nonmagnetic. The spacer layer 70 may be an insulator, such as a tunneling barrier, or may be a conductor.

The free layer 80 is magnetic and thermally stable when quiescent (when the magnetic junction 50 is not be written). The free layer 80 also includes a CoFeB layer 82 used to enhance magnetoresistance, a coupling layer layer 84 and multiple repeats of a Co layer 86 and a Pt layer 88. This portion of the free layer 80 may be considered to include multiple repeats of a Co 86/Pt 88 bilayer followed by an additional Co layer 86. This portion of the free layer 80 may also be thick, for example on the order of forty nanometers in thickness.

In order to write to the magnetic junction 50, a write current is driven in the perpendicular-to-plane direction (e.g. the +−z direction). As the write current is driven through the magnetic junction 50, spin transfer based switching may be used to switch the free layer 80. For example, the CoFeB layer 82 may be switched due to spin transfer. In addition, heat due to the write current and/or an external source, such as a heater, heats the free layer 80. The free layer 80 is thermally sensitive due primarily to the Co 86/Pt 88 multilayer. The free layer 80 may be heated above a magnetic ordering temperature of the Co 86/Pt 88 multilayer. For example, the temperature of the free layer 80 during writing may be above the Curie temperature ($T_c$) of Co. Thus, the Co 86/Pt 88 multilayer may be paramagnetic during writing. Once writing is considered to be completed, the write current is removed. The temperature of the free layer 80 then drops below the Curie temperature of the free layer 80. The free layer 80, including layers 82, 84, 86 and 88, may then become magnetically stable after the write operation is complete.

Although the more recently developed magnetic junction 80 may be written, it may also be prone to errors. As the magnetic junction 80 cools, the Co layers 86 far from the reference layer 60 may drop below their Curie temperature first. Because these layer(s) 86 are far from the CoFeB layer 82 that is switched using spin transfer only, these layer(s) 86 may stabilize with their magnetic moment in a different direction than the magnetic moment of the CoFeB layer 82. As a result, the magnetic moment of the free layer 80 may not be in the desired direction. Errors may thus be introduced in the magnetic junction 50. Performance of the magnetic junction 50 may suffer.

Figure 3:
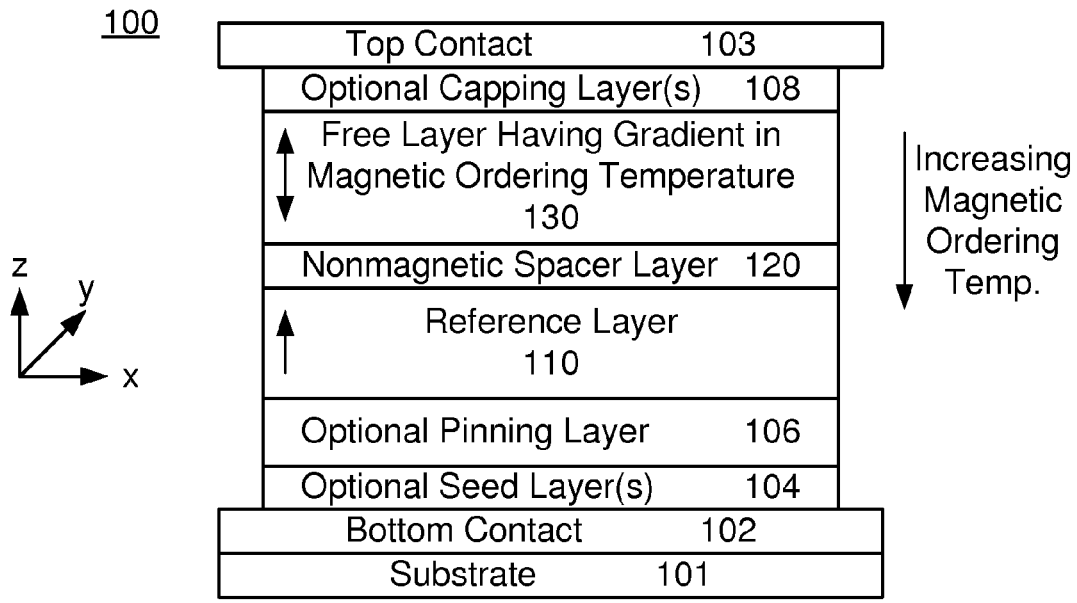
FIG. 3 depicts an exemplary embodiment of a magnetic junction usable in a magnetic memory programmable using spin transfer torque and which includes a free layer having a gradient in the magnetic ordering temperature.

FIG. 3 depicts an exemplary embodiment of a magnetic junction 100 as well as surrounding structures. For clarity, FIG. 3 is not to scale. The magnetic junction may be used in a magnetic device such as a spin transfer torque random access memory (STT-RAM) and, therefore, in a variety of electronic devices. The magnetic junction 100 includes a reference layer 110, a nonmagnetic spacer layer 120, and a free layer 130. Also shown is an underlying substrate 101 in which devices including but not limited to a transistor may be formed. Although layers 110, 120, and 130 are shown with a particular orientation with respect to the substrate 101, this orientation may vary in other embodiments. For example, the reference layer 110 may be closer to the top (furthest from a substrate) of the magnetic junction 100. Also shown are optional seed layer 104, optional pinning layer 106, and optional capping layer 108. The optional pinning layer 106 may be used to fix the magnetization (not shown) of the reference layer 110. In some embodiments, the optional pinning layer 106 may be an AFM layer or multilayer that pins the magnetization (not shown) of the pinned layer 110 by an exchange-bias interaction. However, in other embodiments, the optional pinning layer 106 may be omitted or another structure may be used. For example, if the perpendicular magnetic anisotropy energy of the reference layer 110 exceeds the out of plane demagnetization energy, the magnetic moment of the reference layer 110 may be perpendicular to plane. In such embodiments, the pinning layer 106 may be omitted. The magnetic junction 100 is also configured to allow the free layer 130 to be switched between stable magnetic states when a write current is passed through the magnetic junction 100. Thus, the free layer 130 is switchable utilizing spin transfer torque.

The reference layer 110 is magnetic and may have its magnetization pinned, or fixed, in a particular direction. Although depicted as a simple layer, the reference layer 110 may include multiple layers. For example, the reference layer 110 may be a SAF including magnetic layers antiferromagnetically or ferromagnetically coupled through thin layers, such as Ru. In such a SAF, multiple magnetic layers interleaved with thin layer(s) of Ru or other material may be used. The reference layer 110 may also be another multilayer. In the embodiment depicted in FIG. 3, the reference layer 110 may have a perpendicular anisotropy energy that exceeds the out-of-plane demagnetization energy. Thus, the reference layer 110 may have its magnetic moment oriented perpendicular to plane. Other orientations of the magnetization of the reference layer 110 are possible. In other embodiments, for example, the magnetic moment of the reference layer 110 may be in-plane.

The spacer layer 120 is nonmagnetic. In some embodiments, the spacer layer 120 is an insulator, for example a tunneling barrier. In such embodiments, the spacer layer 120 may include crystalline MgO, which may enhance the TMR of the magnetic junction as well as the perpendicular magnetic anisotropy of the free layer 130. In other embodiments, the spacer layer 120 may be a conductor, such as Cu. In alternate embodiments, the spacer layer 120 might have another structure, for example a granular layer including conductive channels in an insulating matrix.

The free layer 130 is magnetic and is written using a current driven through the magnetic junction 100. In some embodiments, the free layer 130 is a multilayer. For example, the free layer 130 maybe a SAF and/or may include multiple adjoining ferromagnetic layers that are exchange coupled. Other multilayers may also be used. In other embodiments, the free layer 130 may be a single layer. In the embodiment depicted in FIG. 3, the free layer 130 has a perpendicular anisotropy energy that exceeds the out-of-plane demagnetization energy. Thus, the free layer 130 may have its magnetic moment oriented perpendicular to plane. Because this magnetic moment is switchable, it is depicted as a dual headed arrow in FIG. 3. In other embodiments, other directions are possible for the magnetic moment of the free layer 130. For example, the free layer 130 may have its magnetic moment stable in-plane or at an angle from the z-direction.

The free layer 130 is thermally stable when the magnetic junction 100 is not being written (quiescent). In some embodiments, therefore, the thermal stability coefficient, Δ, of the free layer 130 is at least sixty at non-programming operating temperatures (e.g. at or somewhat above room temperature). During writing, however, the free layer 130 may be at least partially thermally unstable. The thermal stability coefficient, Δ, of at least part of the free layer 130 may go close to or reach zero at temperatures the free layer 130 reaches during writing. For such temperatures, at least a portion of the free layer 130 may be magnetically disordered (e.g. paramagnetic or superparamagnetic rather than ferromagnetic).

The free layer 130 also has a gradient in the magnetic ordering temperature. Stated differently, the free layer 130 has a magnetic ordering temperature that spatially varies. In some embodiments, the magnetic ordering temperature varies in the direction of the write current. In some embodiments, the gradient in the magnetic ordering temperature is perpendicular to plane. In such embodiments, the magnetic ordering temperature is substantially constant in a direction parallel to the interfaces between the free layer 130 and another layer. Because of this gradient, some portions of the free layer may be magnetically ordered (e.g. ferromagnetic) at a particular temperature while others having a lower magnetic ordering temperature may be disordered (e.g. paramagnetic). The gradient in the magnetic ordering temperature may be configured such that a first portion of the free layer 130 closer to the reference layer 110 has a first magnetic ordering temperature higher than a second magnetic ordering temperature of a second portion of the free layer 130 further from the reference layer 110. In some embodiments, the gradient in the magnetic ordering temperature is such that the magnetic ordering temperature of the free layer 130 monotonically decreases with increasing distance from the reference layer 110. Portions of the free layer 130 closer to the reference layer 110 become magnetically ordered at higher temperatures than portion(s) of the free layer 130 further from the reference layer 110. In other words, portions of the free layer 130 closer to the reference layer 110 may undergo a transition between paramagnetic and ferromagnetic (e.g. magnetically disordered and magnetically ordered) at higher temperatures than portions of the free layer 130 further from the reference layer 110. In some embodiments, the free layer 130 may be configured such that portion(s) of the free layer 130 remains magnetically ordered throughout operation and the gradient in the magnetic ordering temperature is such that the magnetic ordering temperature decreases with increasing distance from the magnetically ordered portion(s) of the free layer 130. This decrease in magnetic ordering temperature with increasing distance from the reference layer 110 and/or magnetically ordered region may be linear, piece-wise linear, step-wise, follow a curve or occur in another fashion. The temperature difference between the highest and lowest magnetic ordering temperatures may be at least ten degrees Celsius and not more than one hundred twenty degrees Celsius. In some embodiments, the temperature difference between the highest and lowest magnetic ordering temperatures may be at least twenty degrees Celsius and not more than fifty degrees Celsius.

The variation of magnetic ordering temperature within the free layer 130 may be controlled by configuring various parameters of the free layer 130. For example, a gradient in the Curie temperature of the free layer 130 may result in a gradient in the magnetic ordering temperature. The free layer may be configured such that the Curie temperature decreases with increasing distance from the reference layer. In some embodiments, this is achieved by varying the composition of the free layer 130. In other embodiments, a multilayer including magnetic layers having different Curie temperatures may be used. The critical temperature of a magnetic exchange coupling between portions of the free layer 130 and/or between the free layer 130 and another layer may be varied. Portions of the free layer having a higher exchange coupling may become magnetically ordered at higher temperatures than those with a weaker exchange coupling. A gradient in the saturation magnetization ($M_s$) of the free layer 130 may also cause a gradient in the magnetic ordering temperature of the free layer. An anisotropy ($H_k$) gradient, particularly a perpendicular anisotropy gradient, may also affect the magnetic ordering temperature of portions of the free layer 130. In general, a higher saturation magnetization and/or a higher anisotropy corresponds to a higher magnetic ordering temperature. A gradient in the product of the saturation magnetization and a thickness of a corresponding portion of the free layer 130 ($M_s$ multiplied by local thickness such as sublayer thickness=$M_s$*t) may result in a gradient in the magnetic ordering temperature of the free layer 130. Similarly, a gradient in a product of a perpendicular anisotropy constant and thickness ($H_k$ multiplied by local thickness such as sublayer thickness=$H_k$*t) may result in a gradient in the magnetic ordering temperature of the free layer 130. The exchange current density may also have a gradient over a particular temperature range and/or stray magnetic field may have a gradient that results in a gradient in the magnetic ordering temperature of the free layer 130. Any of the above parameters, separately or in any combination, may be used to configure the free layer 130 to have a gradient in the free layer magnetic ordering temperature.

Configuration of the above parameters resulting in a desired gradient in the magnetic ordering temperature of the free layer 130 may be achieved by controlling the structure of the free 130. For example, the free layer 130 may include magnetic layers. Two or more of these layers may be interleaved with nonmagnetic layers. The properties of the magnetic layers, as well as the nonmagnetic layers, may be engineered in order to provide the desired gradient in magnetic ordering temperature. For example, the material(s) and/or concentration of materials within the magnetic layers, the thickness of the magnetic layers and/or other aspects of structure may be varied to affect the Curie temperature, exchange coupling, $M_s$, $H_k$, $M_s$*t, $H_k$*t or other parameters that affect magnetic ordering temperature. Note that these features may be varied between layers as well as within layers. For example, the concentration of a ferromagnetic constituent of the magnetic layer may change within a layer and from layer-to-layer. Similarly, the thickness and composition of the nonmagnetic layers may be varied to affect the coupling between the magnetic layers. If the free layer 130 includes a single thermally sensitive layer, then the composition of the single layer may be varied. For example, the concentration of magnetic element(s), such as Co and/or Fe, may be varied to provide the desired magnetic parameters and gradient in the magnetic ordering temperature.

In operation, a write current is driven through the magnetic junction 100 in the current perpendicular-to-plane (CPP) configuration to program the magnetic junction 100. In FIG. 3, the write current is driven between the contacts 101 and 103, substantially in the z-direction. The write current alone or in addition to heat from another source heats the free layer 130. In some embodiments, an additional line or heater (not shown in FIG. 3) is used to heat the magnetic junction 100 being programmed. At least part of the free layer 130 becomes magnetically disordered. These part(s) of the free layer 130 have magnetic ordering temperature(s) that are below the temperature the free layer 130 reaches during a write operation. In addition, spin transfer from a polarized spin current due to the reference layer 110 may be used to switch the magnetically ordered portion of the free layer 130. This portion of the free layer 130 may be closest to the reference layer 110. The write current and/or additional source of heat may be removed or reduced. The free layer 130 begins to cool. Because of the gradient in magnetic ordering temperature, the portion of the free layer 130 closer to the magnetically ordered portion of the free layer 130 that has been switched reaches its magnetic ordering temperature first. In at least some embodiments, these portions of the free layer 130 are closer to the reference layer 110. As a result, these regions closer to the reference layer 110 and which may be magnetically coupled to the already-ordered portion of the free layer 130 become magnetically ordered in the desired direction. As the temperature of the free layer 130 continues to decrease, regions in the free layer 130 further from the reference layer 110 also transition to being magnetically ordered. Because these regions are magnetically coupled to already-ordered portions of the free layer 130, these regions also become ordered with their magnetic moments in the desired direction as the free layer 130. Thus, the magnetic moment of the free layer 130 may be reliably switched to the desired direction.

For a read operation, a read current may be driven through the magnetic junction 100 and the state determined based on magnetoresistance. The gradient in magnetic ordering temperature is set such that the free layer 130 remains magnetically ordered during a read operation. Thus, the magnetic ordering temperatures of all portions of the free layer 130 are higher than the temperature(s) expected to be reached during reading. Thus, a read operation generally does not change the state of the magnetic junction 100.

The magnetic junction 100 and free layer 130 may have improved performance. The free layer 130 may be switched using spin transfer torque. Thus, a more localized physical phenomenon may be used to write to the free layer 130. The thermal properties of the free layer 130 and magnetic junction 100 may also be configured. In particular, the magnetic moment of the free layer 130 may be reliably switched. Because higher temperature switching may be used, the write current may be reduced and/or switching may be performed more rapidly. Thus, the magnetic junction 100 may have improved performance.

Figure 4:
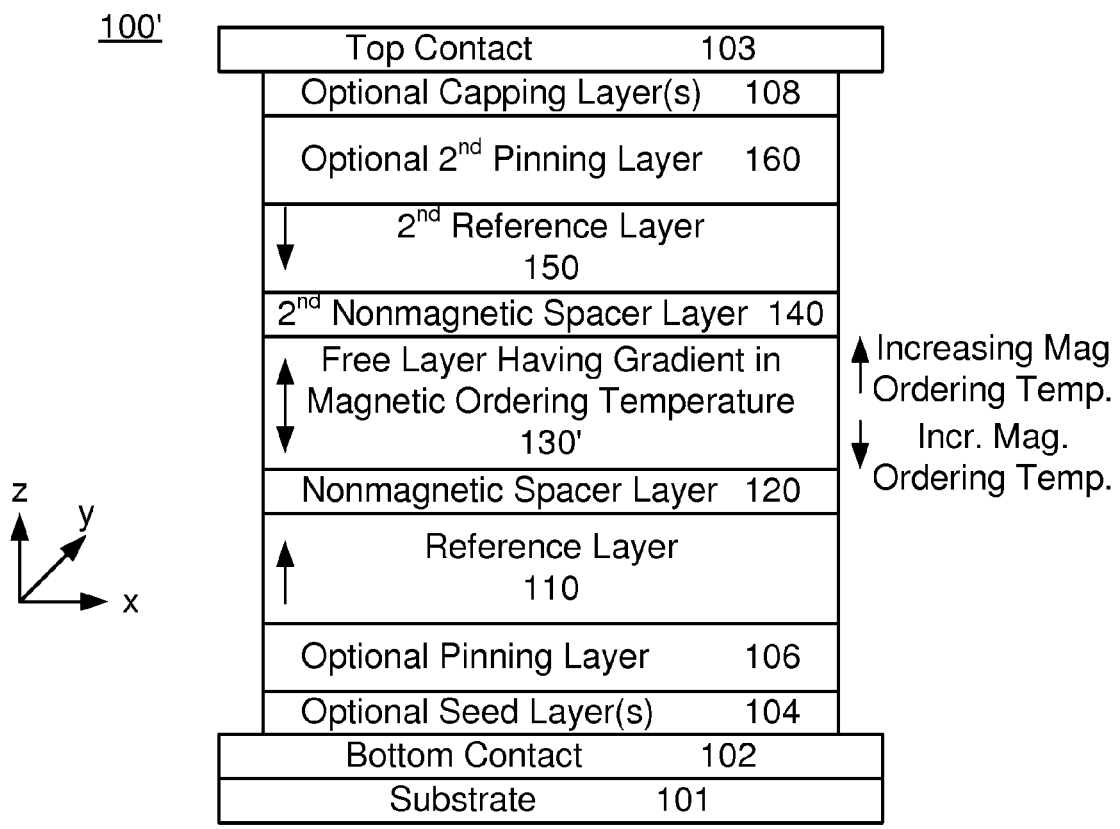
FIG. 4 depicts another exemplary embodiment of a magnetic junction usable in a magnetic memory programmable using spin transfer torque and which includes a free layer having a gradient in the magnetic ordering temperature.

FIG. 4 depicts another exemplary embodiment of a magnetic junction 100' usable in a magnetic device as well as surrounding structures. For clarity, FIG. 4 is not to scale. The magnetic junction 100' may be used in a magnetic device such as a STT-RAM and, therefore, in a variety of electronic devices. The magnetic junction 100' is analogous to the magnetic junction 100. Consequently, analogous components are labeled similarly. Thus, the magnetic junction 100' includes a reference layer 110, a nonmagnetic spacer layer 120, and a free layer 130' that are analogous to the layers 110, 120 and 130, respectively, for the magnetic junction 100. Also shown are an underlying substrate 101, optional seed layer 104, optional pinning layer 106, and optional capping layer 108 that are analogous to those depicted with the magnetic junction 100. The magnetic junction 100' also includes a second nonmagnetic spacer layer 140, a second reference layer 150 and an optional second pinning layer 160. The layers 140, 150 and 160 are analogous to the layers 120, 110 and 106, respectively. Thus, the layers 140, 150 and 160 have a similar structure and function to the layers 120, 110 and 106, respectively.

In some embodiments, the magnetizations of the reference layers 110 and 150 are oriented antiparallel (dual state), which may result improved writing via spin transfer torque. Such a state is depicted in FIG. 4. In other embodiments, the magnetizations of the reference layers 110 and 150 are oriented parallel (antidual state), which may enhance magnetoresistance. In other embodiments, the orientations of the magnetic moments of the reference layers 110 and 150 may be set differently for read and write operations. In still other embodiments, other orientations are possible. Further, the magnetic moments of the reference layers 110 and 150 may differ in magnitude.

The free layer 130' has a gradient in magnetic ordering temperature. In some embodiments, the free layer 130' is configured in a similar manner to the free layer 130 in that the magnetic ordering temperature decreases with increasing distance from either of the reference layers 110 and 150. The magnetic ordering temperature of the free layer 130' general decreases with increasing distance from the interfaces with the spacer layers 120 and 140. The minimum in the magnetic ordering temperature occurs near the center of the free layer 130' in the z-direction. In some embodiments, the minimum occurs in a central, or intermediate region of the free layer 130' along the z-direction. In other embodiments, the minimum in the magnetic ordering temperature may not occur at the center of the free layer 130'. The variation in magnetic ordering temperature may, but need not, be symmetric with respect to the up and down directions (toward the positive and negative z-directions respectively).

Because of this gradient, some portions of the free layer 130' near the upper and lower interfaces may be magnetically ordered at a particular temperature while other portions closer to the center of the free layer 130 having a lower magnetic ordering temperature may be disordered. In some embodiments, the gradient in the magnetic ordering temperature is such that the magnetic ordering temperature of the free layer 130' monotonically decreases with increasing distance from the reference layers 110 and 150. Portions of the free layer 130' closer to the reference layers 110 and 150 become magnetically ordered at higher temperatures than portion(s) of the free layer 130' further from the reference layers 110 and 150. In some embodiments, this decrease in magnetic ordering temperature with increasing distance from the reference layers 110 and 150 may be linear, piece-wise linear, step-wise, follow a curve or occur in another fashion.

The variation of magnetic ordering temperature within the free layer 130' may be controlled by configuring various parameters of the free layer 130' in a manner similar to that discussed above. For example, one or more of a gradient in the Curie temperature of the free layer 130'; a variation in the critical temperature of a magnetic exchange coupling between portions of the free layer 130' and/or between the free layer 130' and another layer; a gradient in the saturation magnetization of the free layer 130'; a gradient in the anisotropy particularly a perpendicular anisotropy gradient for the free layer 130'; a variation in the product of the saturation magnetization and a thickness of a corresponding portion of the free layer 130'; a gradient in a product of a perpendicular anisotropy constant and thickness; a gradient in the exchange current density over a particular temperature range; and/or a gradient in the stray magnetic field may result in a gradient in the magnetic ordering temperature. Any of the above parameters, separately or in any combination, may be used to configure the free layer 130' to have a gradient in the free layer magnetic ordering temperature such that portions of the free layer 130' closer to the reference layers 110 and 150 have a higher magnetic ordering temperature.

The desired gradient in magnetic ordering temperature, as well as the parameters described above, may be achieved in an analogous manner to that used for the free layer 130. Thus, the magnetic ordering temperature may be configured by controlling the structure of the free 130. For example, the free layer 130' may include magnetic layer(s), as well as the nonmagnetic layers, that may be engineered in order to provide the desired gradient in magnetic ordering temperature. For example, the material(s) and/or concentration of materials within the magnetic layers, the thickness of the magnetic layers and/or other aspects of structure may be varied to affect the Curie temperature, exchange coupling, $M_s$, $H_k$, $M_s$*t, $H_k$*t or other parameters that affect magnetic ordering temperature. Note that these features may be varied between layers as well as within layers. Similarly, the thickness and composition of the nonmagnetic layers may be varied to affect the coupling between the magnetic layers. For a simple free layer, the composition of the alloy (atomic percentage of elements or the inclusion/omission of elements) may be used to configure the magnetic ordering temperature of the free layer 130'.

The free layer 130' is programmed in an analogous manner to the free layer 130. A write current is driven through the magnetic junction. Spin transfer from a polarized spin current due to the reference layer(s) 110 and/or 150 may be used to switch the magnetically ordered portion of the free layer 130' closer to the layers 110 and/or 150. Because of the write current or another heat source, the temperature of the free layer 130' rises and at least an intermediate part of the free layer 130' becomes magnetically disordered. The write current and/or additional source of heat may be removed or reduced. The free layer 130' begins to cool. Because of the gradient in magnetic ordering temperature, the portions of the free layer 130' closer to the magnetically ordered portion of the free layer 130' reach their magnetic ordering temperature(s) first. In at least some embodiments, these portions of the free layer 130' are closer to the reference layers 110 and 150. These regions closer to the reference layers 110 and 150 become magnetically ordered in the desired direction first. As the temperature of the free layer 130' continues to decrease, regions in the free layer 130' further from the reference layers 110 and 150 and closer to the center of the free layer 130' also transition to being magnetically ordered. Because these regions are magnetically coupled to already-ordered portions of the free layer 130', these regions become ordered with their magnetic moments in the desired direction as the free layer 130'. Thus, the magnetic moment of the free layer 130' may be reliably switched to the desired direction.

The magnetic junction 100' is read in an analogous manner to the magnetic junction 100. The gradient in magnetic ordering temperature is set such that the free layer 130' remains magnetically ordered during a read operation. The magnetic ordering temperatures of all portions of the free layer 130' are generally desired to be higher than the temperature(s) expected to be reached during reading. Thus, a read operation generally does not disturb the state of the magnetic junction 100'.

The magnetic junction 100' and free layer 130' share the benefits of the magnetic junction 100. The free layer 130' may be switched using spin transfer torque. Thus, a more localized physical phenomenon may be used to write to the free layer 130'. The thermal properties of the free layer 130' and magnetic junction 100' may also be configured. The magnetic moment of the free layer 130' may be reliably switched. Because higher temperature switching may be used, the write current may be reduced and/or switching may be performed more rapidly. Thus, the magnetic junction 100' may have improved performance.

Figure 5:
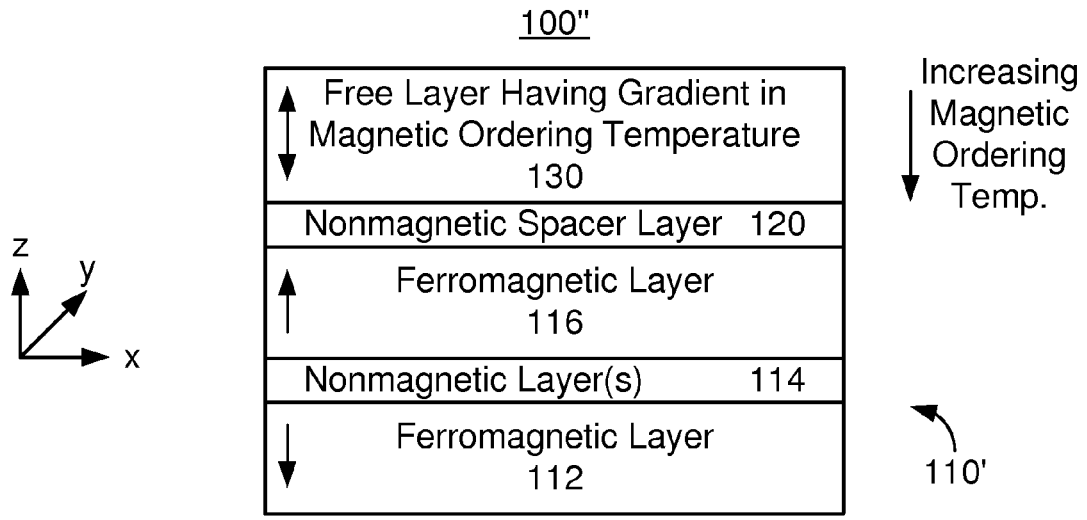
FIG. 5 depicts another exemplary embodiment of a magnetic junction usable in a magnetic memory programmable using spin transfer torque and which includes a free layer having a gradient in the magnetic ordering temperature.

FIG. 5 depicts another exemplary embodiment of a magnetic junction 100" usable in a magnetic device. For clarity, FIG. 5 is not to scale. The magnetic junction 100" may be used in a magnetic device such as a STT-RAM and, therefore, in a variety of electronic devices. The magnetic junction 100" is analogous to the magnetic junctions 100 and 100'. Consequently, analogous components are labeled similarly. Thus, the magnetic junction 100" includes a reference layer 110', a nonmagnetic spacer layer 120, and a free layer 130 that are analogous to the layers 110, 120 and 130, respectively, for the magnetic junction 100. The magnetic junction 100" is also configured to allow the free layer 130 to be switched between stable magnetic states when a write current is passed through the magnetic junction 100". Thus, the free layer 130 is switchable utilizing spin transfer torque. Although not shown, the magnetic junction 100" may include a pinning layer analogous to the pinning layer 106.

Although the reference layer 110' is analogous to the reference layer 110, the reference layer 110' is also a multilayer. In the embodiment shown in FIG. 5, the reference layer 110' is a SAF. The reference layer 110' includes ferromagnetic layers 112 and 116 separated by the nonmagnetic layer 114, such as Ru. The ferromagnetic layers 112 and 116 have perpendicular anisotropy energies that exceed their out-of-plane demagnetization energies. Thus, the ferromagnetic layers 112 and 116, as well as the reference layer 110', have their magnetic moments oriented perpendicular-to-plane as depicted in FIG. 5. In other embodiments, other orientations of the magnetization of the reference layer 110' are possible.

The free layer 130 has a gradient in magnetic ordering temperature that is analogous to that for the magnetic junction 100. Portions of the free layer 130 closer to the reference layer 110' may be magnetically ordered at a particular temperature while others further from the reference layer 110' having a lower magnetic ordering temperature may be disordered. The variation of magnetic ordering temperature within the free layer 130 may be controlled by configuring various parameters of the free layer 130 in a manner similar to that discussed above. Any of the above parameters, separately or in any combination, may be used to configure the free layer 130 to have a gradient in the free layer magnetic ordering temperature such that portions of the free layer 130 closer to the reference layer 110' have a higher magnetic ordering temperature. The desired gradient in magnetic ordering temperature, as well as the parameters described above, may be achieved in an analogous manner to that used for the free layer 130. Thus, the magnetic ordering temperature may be configured by controlling the structure of the free 130 as described above.

The free layer 130 is programmed and read in an analogous manner to the free layer 130. During writing using a current driven through the magnetic junction, part of the free layer 130 becomes magnetically disordered. In addition, spin transfer from a polarized spin current due to the reference layer 110' may be used to switch the magnetically ordered portion of the free layer 130 closer to the layer 110'. The write current and/or additional source of heat may be removed or reduced. The free layer 130 cools and becomes ordered from the region closest to the reference layer 110' to the region furthest from the reference layer 110'. As the temperature of the free layer 130 continues to decrease, regions in the free layer 130 further from the reference layer 110' also transition to being magnetically ordered. Because these regions are magnetically coupled to already-ordered portions of the free layer 130, these regions also become ordered with their magnetic moments in the desired direction as the free layer 130. Thus, the magnetic moment of the free layer 130 may be reliably switched to the desired direction. The magnetic junction 100" is read in an analogous manner to the magnetic junctions 100 and 100'. The gradient in magnetic ordering temperature is set such that the free layer 130 remains magnetically ordered during a read operation. Thus, a read operation generally does not disturb the state of the magnetic junction 100".

The magnetic junction 100" shares the benefits of the magnetic junction 100 and 100'. The free layer 130 may be switched using spin transfer torque. Thus, a more localized physical phenomenon may be used to write to the free layer 130. The thermal properties of the free layer 130 and magnetic junction 100 may also be configured. The magnetic moment of the free layer 130 may be reliably switched. Because higher temperature switching may be used, the write current may be reduced and/or switching may be performed more rapidly. Thus, the magnetic junction 100" may have improved performance.

Figure 6:
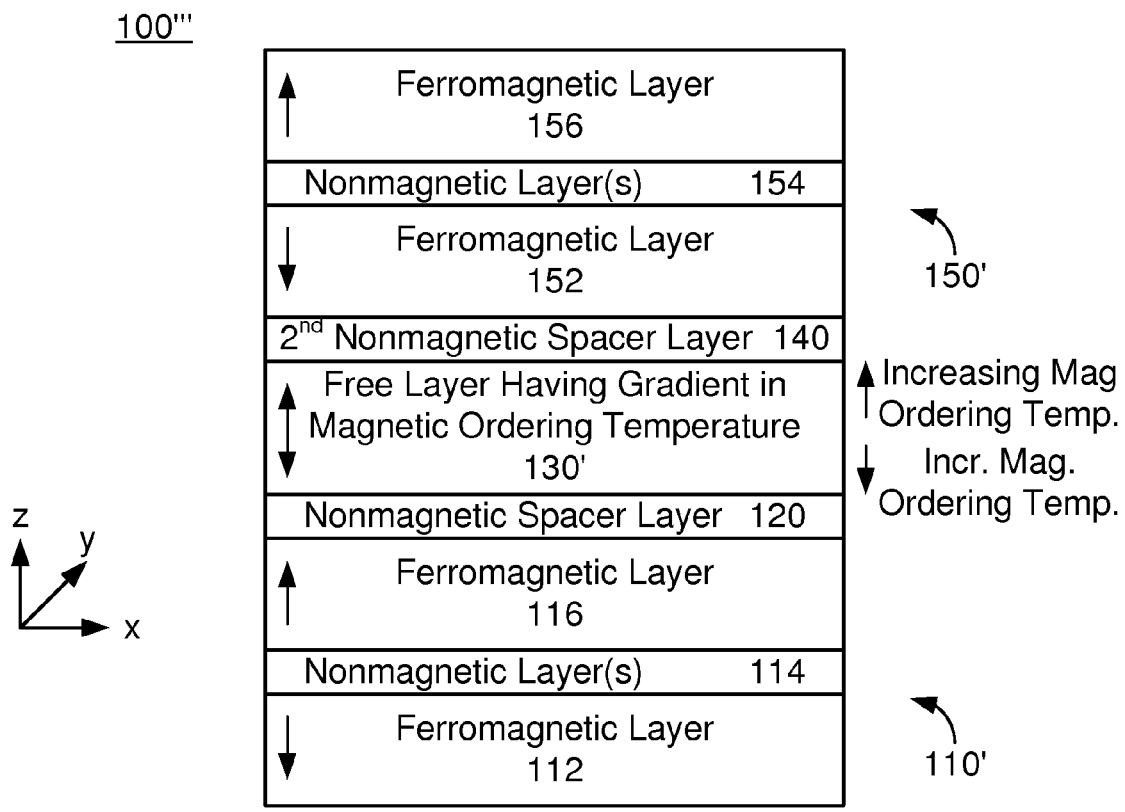
FIG. 6 depicts another exemplary embodiment of a magnetic junction usable in a magnetic memory programmable using spin transfer torque and which includes a free layer having a gradient in the magnetic ordering temperature.

FIG. 6 depicts another exemplary embodiment of a magnetic junction 100''' usable in a magnetic device. For clarity, FIG. 6 is not to scale. The magnetic junction 100''' may be used in a magnetic device such as a STT-RAM and, therefore, in a variety of electronic devices. The magnetic junction 100''' is analogous to the magnetic junctions 100, 100' and 100". Consequently, analogous components are labeled similarly. Thus, the magnetic junction 100''' includes a reference layer 110', a nonmagnetic spacer layer 120, a free layer 130', a second nonmagnetic spacer layer 140 and a second reference layer 150' that are analogous to the layers 110/110', 120, 130/130', 140 and 150, respectively, for the magnetic junction 100/100'/100". The magnetic junction 100' is also configured to allow the free layer 130' to be switched between stable magnetic states when a write current is passed through the magnetic junction 100. Thus, the free layer 130' is switchable utilizing spin transfer torque. Although not shown, the magnetic junction 100''' may include pinning layers analogous to the pinning layers 106 and 160.

The reference layer 150' is magnetic and may have its magnetization pinned, or fixed, in a particular direction during at least a portion of the operation of the magnetic junction. The reference layer 150' includes multiple layers. In the embodiment shown in FIG. 6, the reference layer 150' is a SAF. The reference layer 150' includes ferromagnetic layers 152 and 156 separated by the nonmagnetic layer 154, such as Ru. The reference is thus analogous to the reference layer 110'. In the embodiment shown in FIG. 6, both layers 150' and 110' are depicted as SAFs. However, one of the layers 150' or 110' may be a simple layer.

The free layer 130' has a gradient in magnetic ordering temperature that is analogous to that for the magnetic junctions 100, 100' and 100". The free layer 130' may thus be configured such that the magnetic ordering temperature decreases with increasing distance from the reference layers 110' and 150'. The free layer 130' is thus analogous to the free layer 130' depicted in FIG. 4. Because of this gradient, some portions of the free layer 130' closer to the reference layers 110' and 150' may be magnetically ordered at a particular temperature while others further from the reference layers 110' and 150' having a lower magnetic ordering temperature may be disordered. The variation of magnetic ordering temperature within the free layer 130' may be controlled by configuring various parameters of the free layer 130' in a manner similar to that discussed above. For example, one or more of a gradient in the Curie temperature of the free layer 130'; a variation in the critical temperature of a magnetic exchange coupling between portions of the free layer 130' and/or between the free layer 130' and another layer; a gradient in the saturation magnetization of the free layer 130'; a gradient in the anisotropy particularly a perpendicular anisotropy gradient for the free layer 130'; a variation in the product of the saturation magnetization and a thickness of a corresponding portion of the free layer 130'; a gradient in a product of a perpendicular anisotropy constant and thickness; a gradient in the exchange current density over a particular temperature range; and/or a gradient in the stray magnetic field may result in a gradient in the magnetic ordering temperature. Any of the above parameters, separately or in any combination, may be used to configure the free layer 130' to have a gradient in the magnetic ordering temperature such that portions of the free layer 130' closer to the reference layers 110' and 150' have a higher magnetic ordering temperature. The desired gradient in magnetic ordering temperature, as well as the parameters described above, may be achieved in an analogous manner to that used for the free layer 130'. Thus, the magnetic ordering temperature may be configured by controlling the structure of the free 130' as described above.

The free layer 130' is programmed and read in an analogous manner to the free layers 130 and 130'. During writing, a current is driven through the magnetic junction 100'''. Spin transfer from a polarized spin current due to the reference layers 110' and 150' may be used to switch the magnetically ordered portion of the free layer 130' closer to the layers 110' and 150'. The free layer is also heated such that another part of the free layer 130' is magnetically disordered. The write current and/or additional source of heat may be removed or reduced. The free layer 130' cools and becomes magnetically ordered starting with the regions closest to the reference layers 110' and 150' ending near the regions furthest from the reference layers 110' and 150'. Because these regions are magnetically coupled to already-ordered portions of the free layer 130', these regions also become ordered with their magnetic moments in the desired direction as the free layer 130'. Thus, the magnetic moment of the free layer 130' may be reliably switched to the desired direction. The magnetic junction 100''' is read in an analogous manner to the magnetic junctions 100, 100' and 100". The gradient in magnetic ordering temperature is set such that the free layer 130' remains magnetically ordered during a read operation. Thus, a read operation generally does not disturb the state of the magnetic junction 100'''.

The magnetic junction 100''' share the benefits of the magnetic junction 100, 100' and 100". The free layer 130' may be switched using spin transfer torque. Thus, a more localized physical phenomenon may be used to write to the free layer 130'. The thermal properties of the free layer 130' and magnetic junction 100''' may also be configured. The magnetic moment of the free layer 130' may be reliably switched. Because higher temperature switching may be used, the write current may be reduced and/or switching may be performed more rapidly. Thus, the magnetic junction 100''' may have improved performance.

Figure 7A:
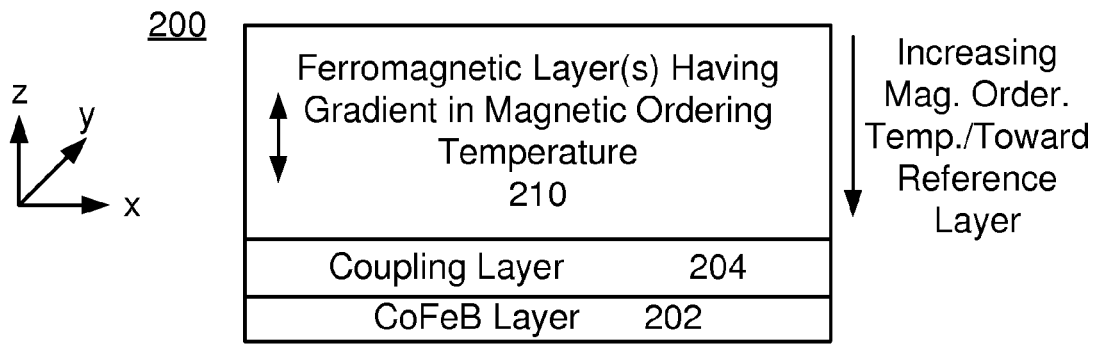
FIGS. 7A-7D depict an exemplary embodiment of a free layer having a gradient in the magnetic ordering temperature and exemplary embodiments of graphs depicting how magnetic ordering temperature may vary with distance from the reference layer.
Figure 7B:
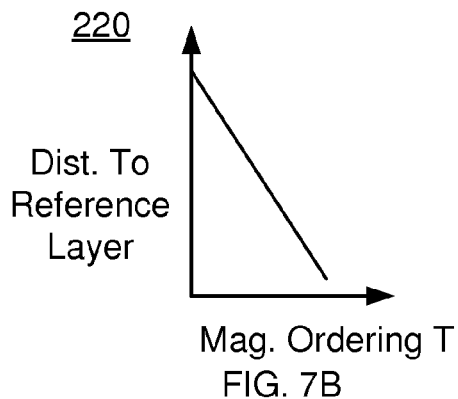
Figure 7C:
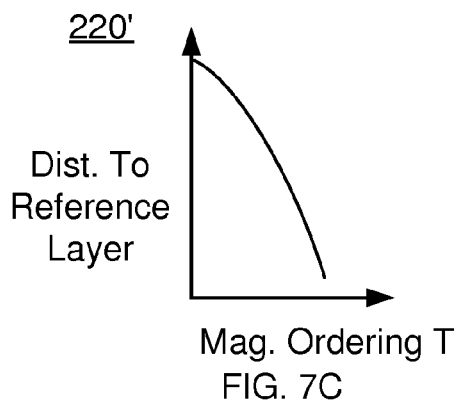
Figure 7D:
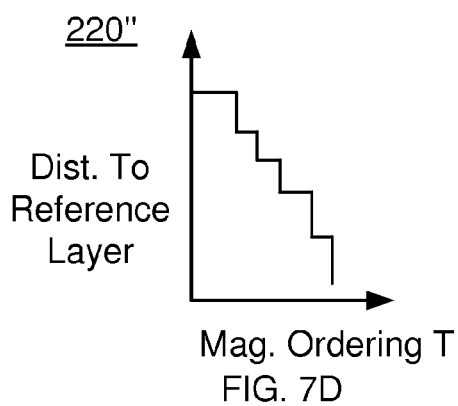

FIG. 7A depicts an exemplary embodiment of a free layer 200 usable in a magnetic junction such as the magnetic junction 100 and/or 100". For clarity, FIG. 7A is not to scale. FIGS. 7B-7D are graphs depicting exemplary embodiments of variations in magnetic ordering temperature versus distance to the reference layer 110/110' for the free layer 200. The free layer 200 is configured to be switched between stable magnetic states when a write current is passed through the magnetic junction 100 or 100". Thus, the free layer 200 is switchable utilizing spin transfer torque. The layer 210 is depicted on top of the layer 204, which is on the layer 202. In other embodiments, the order may be reversed.

The free layer 200 includes a CoFeB layer 202, a coupling layer 204 and a thermal layer 210. The CoFeB layer 202 is closest to the nonmagnetic spacer layer and thus the reference layer, such as the layers 110/110' and 120. The CoFeB layer 202 is configured to enhance the tunneling magnetoresistance (TMR) and/or spin polarized current for spin transfer. Thus, the CoFeB layer 202 may be replaced by another analogous layer. The CoFeB layer 202 remains magnetically stable throughout operation of the free layer 200. The coupling layer 204 may be used to structurally decouple the CoFeB layer from the thermal layer 210. The CoFeB layer 202 is generally body-centered cubic (BCC). The thermal layer 210 may have another crystal structure, including but not limited to hexagonal close-packed (HCP). Thus, the coupling layer 204 may be used to allow the thermal layer 210 to be coupled with the CoFeB layer 202, with each layer 202 and 210 having the desired crystal structure. For example, the coupling layer 204 may be a strongly diluted ferromagnetic or weakly ferromagnetic layer. An example of such layer can be obtained by heavy doping of Fe, Co, CoFe, Ni, FeNi or Mn by nonmagnetic material, such as Ta, W, Ge, Al, Mo, Nb, Bi, Hf. In other embodiments, other materials may be used. For example, the coupling layer 204 may include Fe doped with at least one of W, Ta, Zr, Hf, Mo, Bi, Nb, Al, Ga, and Ge. The Fe concentration may be from forty ninety atomic percent. In some embodiments, the concentration of Fe is at least fifty atomic percent and not more than eighty atomic percent.

The thermal layer 210 has a gradient in magnetic ordering temperature such that the magnetic ordering temperature decreases with increasing distance from the reference layer (not shown in FIG. 7A) and thus with increasing distance from the CoFeB layer 202. The portions of the thermal layer 210 closest to the coupling layer 204 (and thus to the reference layer that is not shown in FIG. 7A) have a higher magnetic ordering temperature than portions of the thermal layer 210. Thus, the portions of the thermal layer 210 closer to the reference layer remain ordered while regions further from the reference layer may be disordered. FIGS. 7B, 7C and 7D depicts embodiments of graphs 220, 220' and 220", respectively, of magnetic ordering temperature versus distance to the reference layer for the thermal layer 210. Note that the graphs terminate slightly above the magnetic ordering temperature axis because there is some space between the thermal layer and the reference layer. For example, a nonmagnetic spacer layer and layers 202 and 204 are between the thermal layer 20 and the reference layer. As can be seen in the graphs 220, 220' and 220", the details of the variation in magnetic ordering temperature with distance from the reference layer can vary. However, the general trend is the same in that the magnetic ordering temperature increases with decreasing distance to the reference layer. The variation of magnetic ordering temperature within the thermal layer 210 may be controlled by configuring various parameters of the thermal layer 210 in a manner similar to that discussed above. For example, one or more of a gradient in the Curie temperature of the thermal layer 210; a variation in the critical temperature of a magnetic exchange coupling between portions of the thermal layer 210 and/or between the thermal layer 210 and another layer such as the CoFeB layer 202; a gradient in the saturation magnetization of the thermal layer 210; a gradient in the anisotropy particularly a perpendicular anisotropy gradient for the thermal layer 210; a variation in the product of the saturation magnetization and a thickness of a corresponding portion of the thermal layer 210; a gradient in a product of a perpendicular anisotropy constant and thickness; a gradient in the exchange current density over a particular temperature range; and/or a gradient in the stray magnetic field may result in a gradient in the magnetic ordering temperature.

Any of the above parameters, separately or in any combination, may be used to configure the thermal layer 210 to have a gradient in the magnetic ordering temperature such that portions of the thermal layer 210 closer to the reference layer and layer 202 have a higher magnetic ordering temperature. The desired gradient in magnetic ordering temperature, as well as the parameters described above, may be achieved in an analogous manner to that used for the free layer 130. Thus, the magnetic ordering temperature may be configured by controlling the structure of the thermal layer 210.

The free layer 200 is programmed and read in an analogous manner to the free layers 130 and 130'. During writing using a current driven through the magnetic junction, the temperature of the free layer 200 increases. This may be due to the write current used and/or an additional source of heat such as a heater. The thermal layer 210 becomes magnetically disordered (in order from the regions furthest from the reference layer/CoFeB layer 202 to the regions closest to the reference layer). The CoFeB layer 202, however, remains magnetic because the magnetic ordering temperature of the CoFeB layer 202 is above the temperature reached by the free layer 200 during programming. Spin transfer from a polarized spin current due to the reference layer may be used to switch the CoFeB layer 202. The write current and/or additional source of heat may be removed or reduced. The thermal layer 210 cools and becomes magnetically ordered starting with the regions closest to the reference layer/CoFeB layer 202 ending near the regions furthest from the reference layer/CoFeB layer 202. Thus, the magnetic moment of the free layer 200 may be reliably switched to the desired direction. The gradient in magnetic ordering temperature is set such that the free layer 200 remains magnetically ordered during a read operation. Thus, the magnetic ordering temperatures of all portions of the free layer 200 are generally desired to be higher than the temperature(s) expected to be reached during reading. Thus, a read operation generally does not disturb the state of the free layer 200.

A magnetic junction using the free layer 200 shares the benefits of the magnetic junction 100, 100', 100" and 100'''. The free layer 200 may be switched using spin transfer torque. The thermal properties of the thermal layer 210 may also be configured for more reliable switching. Because higher temperature switching may be used, the write current may be reduced and/or switching may be performed more rapidly. Thus, the free layer 200 may have improved performance.

Figure 8:
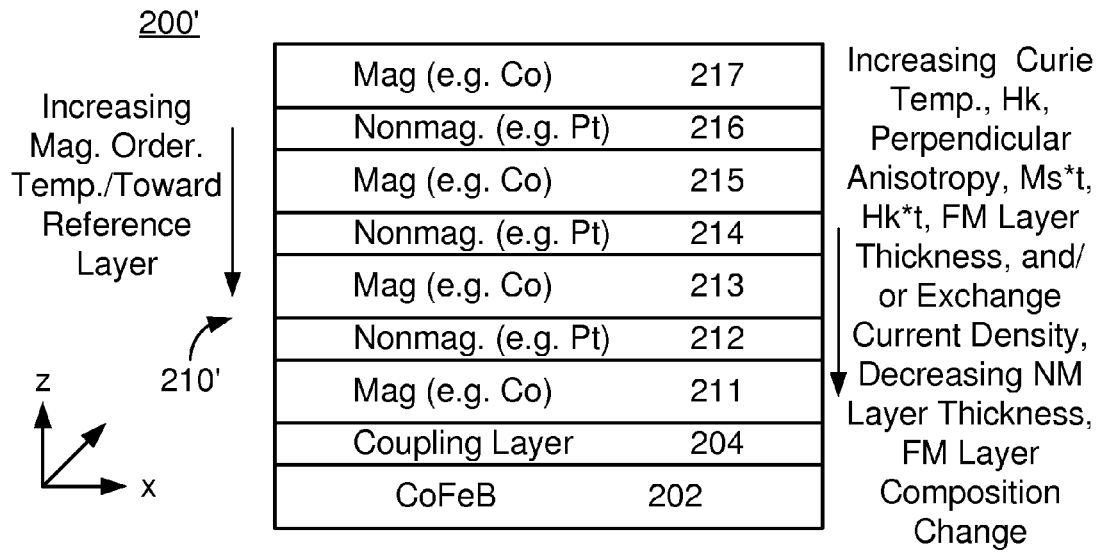
FIG. 8 depicts another exemplary embodiment of a free layer having a gradient in the magnetic ordering temperature.

FIG. 8 depicts an exemplary embodiment of a free layer 200' usable in a magnetic junction such as the magnetic junction 100 and/or 100". For clarity, FIG. 8 is not to scale. The free layer 200' is analogous to the free layer 200. The free layer 200' is configured to be switched between stable magnetic states when a write current is passed through the magnetic junction 100 or 100". Thus, the free layer 200' is switchable utilizing spin transfer torque. The free layer 200' includes a CoFeB layer 202, a coupling 204 and a thermal layer 210' that are analogous to the CoFeB layer 202, the coupling layer 204 and the thermal layer 210, respectively, of the free layer 200. The structure and function of the layers 202, 204 and 210' are thus analogous to that of the layers 202, 204 and 210, respectively.

The thermal layer 210' has a gradient in magnetic ordering temperature such that the magnetic ordering temperature decreases with increasing distance from the reference layer/CoFeB layer 202. The thermal layer 210' includes magnetic layers 211, 213, 215 and 217 interleaved with nonmagnetic layers 212, 214 and 216. For example, the layer 211, 213, 215 and 217 may include Co, while the layers 212, 214 and 216 may include Pd. In another embodiment, a different number of layers and/or different material(s) may be used. From highest to lowest magnetic ordering temperatures, the magnetic layers are layers 211, 213, 215 and 217. Thus, the magnetic layer 211 closest to the reference layer remains ordered while the remaining layers 213, 215 and 217 further from the reference layer may be disordered. Similarly, at a lower temperature, the layers 211 and 213 are ordered, while layers 215 and 217 are disordered. At a lower temperature, layers 211, 213 and 215 are ordered, while the layer 217 is disordered.

The variation of magnetic ordering temperature within the thermal layer 210 may be controlled by configuring various parameters of the magnetic layers 211, 213, 215 and 217 and/or nonmagnetic layers 212, 214 and 216 in a manner similar to that discussed above. For example, one or more of a gradient in the Curie temperature of the magnetic layers 211, 213, 215 and 217; a variation in the critical temperature of a magnetic exchange coupling between magnetic layers 211, 213, 215 and 217 and/or between the magnetic layers 211, 213, 215 and 217 and another layer such as the CoFeB layer 202; a gradient in the saturation magnetization of the magnetic layers 211, 213, 215 and 217; a gradient in the anisotropy particularly a perpendicular anisotropy gradient for the magnetic layers 211, 213, 215 and 217; a variation in the product of the saturation magnetization and a thickness of a corresponding portion of the magnetic layers 211, 213, 215 and 217; a gradient in a product of a perpendicular anisotropy constant and thickness for each of the magnetic layers 211, 213, 215 and 217; a gradient in the exchange current density for the magnetic layers 211, 213, 215 and 217 over a particular temperature range; and/or a gradient in the stray magnetic field at the magnetic layers 211, 213, 215 and 217 may result in a gradient in the magnetic ordering temperature. Any of the above parameters, separately or in any combination, may be used to configure the thermal layer 210' to have a gradient in the magnetic ordering temperature such that the magnetic ordering temperatures occur, from highest to lowest, for magnetic layers 211, 213, 215 and 217.

The desired gradient in magnetic ordering temperature, as well as the parameters described above, may be achieved in an analogous manner to that used for the free layer 130. Thus, the structure of the layers 211, 212, 213, 214, 215, 216 and 217 may be configured to provide the gradient in magnetic ordering temperature. For example, each of the magnetic layers 211, 213, 215 and 217 may include $Co_mFe_{1-m}$ and each of the nonmagnetic layer(s) may include $Pd_nPt_{1-n}$, where m is not less than zero and not greater than one and where n is not less than zero and not greater than one. In such an embodiment, m and/or n may vary within a layer and/or between layers to provide the desired magnetic ordering temperature gradient. In some such embodiments, m may also vary within the layer. As a result, the magnetic ordering temperatures of the magnetic layers 211, 213, 215 and 217 decrease with increasing distance from the reference layer. In another embodiment each of the magnetic layers 211, 213, 215 and 217 may include $Co_pFe_qZ_{1-p-q}$ and each of the nonmagnetic layer(s) may include W, where p is not less than zero and not greater than one and where q is not less than zero and not greater than one. In such an embodiment, p and/or q may vary within a layer and/or between layers to provide the desired magnetic ordering temperature gradient. In another embodiment, each of the magnetic layers 211, 213, 215 and 217 may include $Co_rFe_sZ_{1-r-s}$ and each of the nonmagnetic layer(s) 212, 214 and 216 may include Ta, where r is not less than zero and not greater than one and where s is not less than zero and not greater than one. In such an embodiment, r and/or s may vary within a layer and/or between layers to provide the desired magnetic ordering temperature gradient. In another embodiment each of the magnetic layers 211, 213, 215 and 217 may include $Co_tFe_uZ_{1-t-u}$ and each of the nonmagnetic layer(s) 212, 214, and 216 may include $Fe_vTa_{1-v}$, where t is not less than zero and not greater than one, u is not less than zero and not greater than one, v is not less than zero and not greater than one and Z includes at least one of B and Ga. In such an embodiment, t, u and/or v may vary within a layer and/or between layers to provide the desired magnetic ordering temperature gradient. In another embodiment, each of the magnetic layers 211, 213, 215 and 217 may include $Co_w$-$Fe_xB_{1-w-x}$ and each of the nonmagnetic layers 212, 214 and 216 may include MgO, where w is not less than zero and not greater than one and where x is not less than zero and not greater than one. In such an embodiment, w and/or x may vary within a layer and/or between layers to provide the desired magnetic ordering temperature gradient. In another embodiment, some combination of the above may be used.

The free layer 200' is programmed and read in an analogous manner to the free layers 130, 130' and 200. During writing using a current driven through the magnetic junction, the temperature of the free layer 200' increases. As the temperature rises above their magnetic ordering temperatures, the magnetic layer 217, 215, 213 and 211 become magnetically disordered in that order. The magnetic layer 217 becomes magnetically disordered first, followed by magnetic layer 215, magnetic layers 213 and finally by layer 211. In addition, spin transfer from a polarized spin current due to the reference layer may be used to switch the CoFeB layer 202. The write current and/or additional source of heat may be removed or reduced. The magnetic layers 211, 213, 215 and 217 cool and become magnetically ordered in order. The magnetic layer 211 closest to the CoFeB layer 202 first transitions to ferromagnetic/magnetically ordered. Because of the coupling with the layer 202, the magnetic moment of the magnetic layer 211 is aligned with that of the CoFeB layer. As the free layer 200' continues to cool, the magnetic layers 213, 215 and 217 transition to ferromagnetic in order. Thus, the magnetic moment of the free layer 200' may be reliably switched to the desired direction. The gradient in magnetic ordering temperature is set such that the free layer 200' remains magnetically ordered during a read operation. Thus, a read operation generally does not disturb the state of the free layer 200'. A magnetic junction using the free layer 200' thus shares the benefits of the magnetic junction 100, 100', 100" and 100'". Thus, the free layer 200' may have improved performance.

Figure 9:
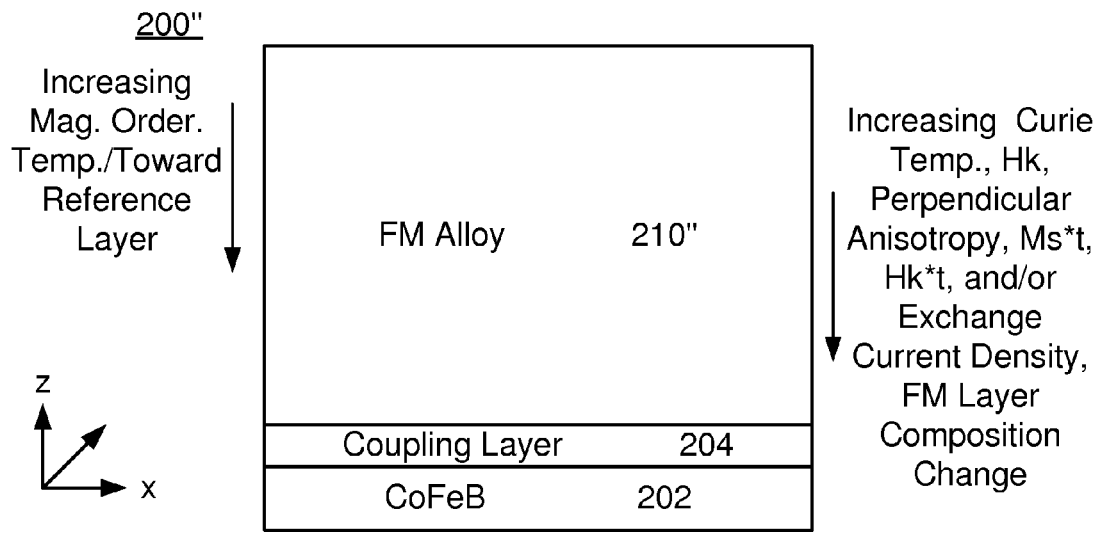
FIG. 9 depicts another exemplary embodiment of a free layer having a gradient in the magnetic ordering temperature.

FIG. 9 depicts an exemplary embodiment of a free layer 200" usable in a magnetic junction such as the magnetic junction 100 and/or 100". For clarity, FIG. 9 is not to scale. The free layer 200" is analogous to the free layers 200 and 200'. The free layer 200" is configured to be switched between stable magnetic states when a write current is passed through the magnetic junction 100 or 100". Thus, the free layer 200" is switchable utilizing spin transfer torque. The free layer 200" includes a CoFeB layer 202, a coupling 204 and a thermal layer 210" that are analogous to the CoFeB layer 202, the coupling layer 204 and the thermal layer 210/210', respectively. The structure and function of the layers 202, 204 and 210" are thus analogous to that of the layers 202, 204 and 210, respectively. The layer 210" is depicted on top of the layer 204, which is on the layer 202. In other embodiments, the order may be reversed.

The thermal layer 210" has a gradient in magnetic ordering temperature such that the magnetic ordering temperature decreases with increasing distance from the reference layer/CoFeB layer 202. The thermal layer 210" is a single magnetic alloy layer that has a varying magnetic ordering temperature. The variation of magnetic ordering temperature within the thermal layer 210" may be controlled by configuring various parameters of the magnetic layer 210" in a manner similar to that discussed above. For example, one or more of a gradient in the Curie temperature of the magnetic layer 210"; a variation in the critical temperature of a magnetic exchange coupling between the magnetic layer 210" and another layer such as the CoFeB layer 202; a gradient in the saturation magnetization of the magnetic layer 210"; a gradient in the anisotropy particularly a perpendicular anisotropy gradient for the magnetic layer 210"; a variation in the product of the saturation magnetization and a thickness of a corresponding portion of the magnetic layer 210"; a gradient in a product of a perpendicular anisotropy constant and thickness for each of the magnetic layer 210"; a gradient in the exchange current density for the magnetic layer 210" over a particular temperature range; and/or a gradient in the stray magnetic field at the magnetic layer 210" may result in a gradient in the magnetic ordering temperature. Any of the above parameters, separately or in any combination, may be used to configure the thermal layer 210" to have a gradient in the magnetic ordering temperature such that the magnetic ordering temperature of the magnetic layer 210" decreases with increasing distance from the reference layer/CoFeB layer 202.

The desired gradient in magnetic ordering temperature, as well as the parameters described above, may be achieved in an analogous manner to that used for the free layer 130. The concentration of the magnetic element(s) and/or the constituents in the magnetic layer 210" may be varied. For example, the magnetic layer 210" may be a single layer formed of an alloy having a composition that varies with a distance from the reference layer. For example, the alloy may include $Co_xFe_yPd_zPt_{1-x-y-z}$, wherein x, y and z are each not less than zero and not greater than one and wherein at least one of x and y is greater than zero. In such a case, x, y and/or z may be varied such that the magnetic ordering temperature of the local region of the thermal layer 210" decreases with increasing distance from the reference layer.

The free layer 200" is programmed and read in an analogous manner to the free layers 130, 130', 200 and 200'. During writing using a current driven through the magnetic junction, the temperature of the free layer 200" increases. Regions of the magnetic layer 210" become magnetically disordered in order from closest to furthest from the CoFeB layer 202. Spin transfer from a polarized spin current due to the reference layer may be used to switch the CoFeB layer 202, which has a magnetic ordering temperature higher than the temperatures reached by the free layer 200" during programming. The write current and/or additional source of heat may be removed or reduced. Portions of the magnetic layer 210" cool and become magnetically ordered in order from closest to furthest from the CoFeB layer 202. Thus, the magnetic moment of the free layer 200" may be reliably switched to the desired direction. The gradient in magnetic ordering temperature is set such that the free layer 200" remains magnetically ordered during a read operation. Thus, a read operation generally does not disturb the state of the free layer 200". A magnetic junction using the free layer 200" shares the benefits of the magnetic junction 100, 100', 100" and 100'". Thus, the free layer 200" may have improved performance.

Figure 10A:
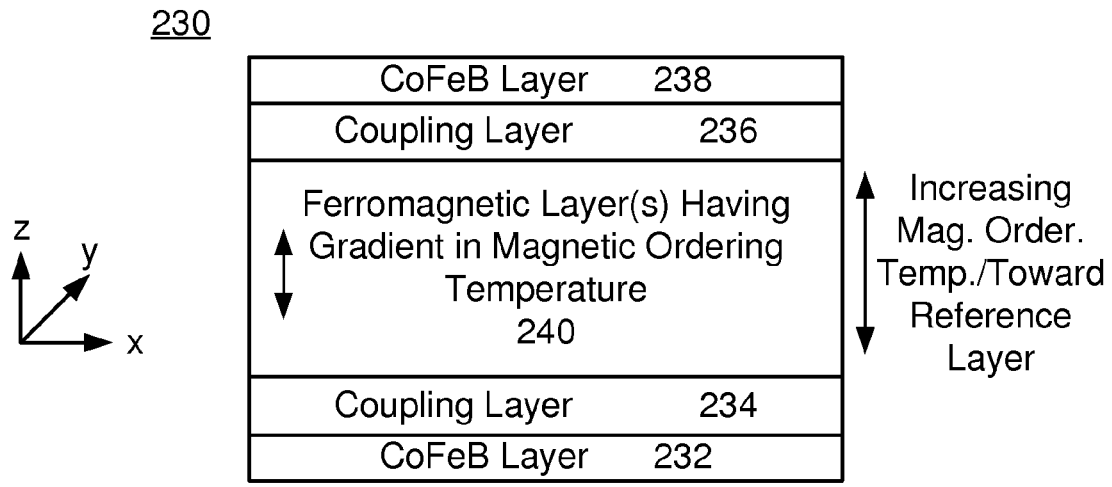
FIGS. 10A-10D depict an exemplary embodiment of a free layer having a gradient in the magnetic ordering temperature and exemplary embodiments of graphs depicting how magnetic ordering temperature may vary with distance from the reference layer.
Figure 10B:
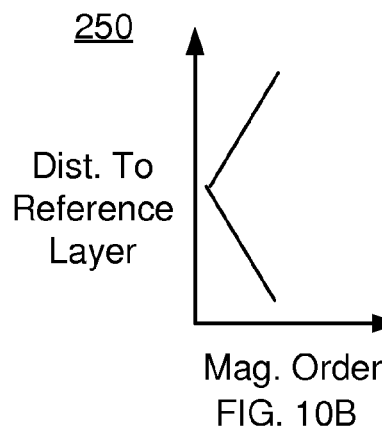
Figure 10C:
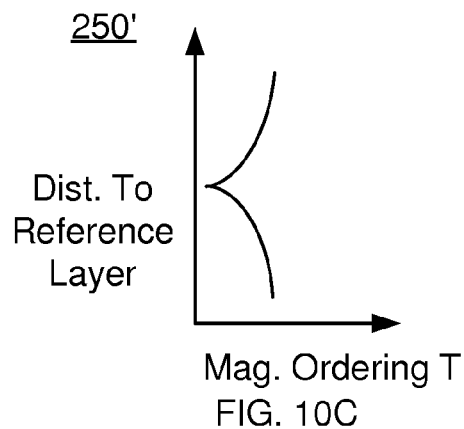
Figure 10D:
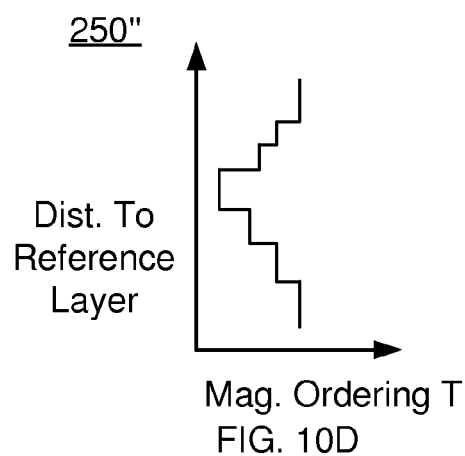

FIG. 10A depicts an exemplary embodiment of a free layer 230 usable in a magnetic junction such as the magnetic junction 100' and/or 100'". Thus, the free layer 230 may be used in a dual magnetic junction. For clarity, FIG. 10A is not to scale. FIGS. 10B-10D are graphs depicting exemplary embodiments of variations in magnetic ordering temperature versus distance to the reference layer 110/110' for the free layer 230. The free layer 230 is configured to be switched between stable magnetic states when a write current is passed through the magnetic junction 100' or 100'". Thus, the free layer 230 is switchable utilizing spin transfer torque. The layer 240 is depicted on top of the layer 234, which is on the layer 232. Similarly, the coupling layer 236 is on the thermal layer 240 and under the layer 238. The layer 238 would be closest to the reference layer 150/50' while the layer 232 is closest to the reference layer 110/110'. In other embodiments, the order of the layers 232, 234, 240, 236 and 238 may be reversed.

The free layer 230 includes a CoFeB layer 232, a coupling layer 234, a thermal layer 240 an additional coupling layer 236 and an additional CoFeB layer 238. The CoFeB layer 202 is closest to the nonmagnetic spacer layer and thus the reference layer, such as the layers 110/110' and 120. The CoFeB layers 232 and 238 are analogous to the CoFeB layer 202. Thus, the CoFeB layers 232 and 238 are configured to enhance the TMR and/or spin polarized current for spin transfer. The CoFeB layers 232 and 238 also have magnetic ordering temperatures above that which are reached during programming of the free layer 230. In other embodiments, the CoFeB layers 232 and/or 238 may be replaced by other analogous layer(s). The coupling layers 234 and 236 may be used to structurally decouple the CoFeB layers 232 and 238 from the thermal layer 240.

The thermal layer 240 has a gradient in magnetic ordering temperature such that the magnetic ordering temperature decreases with increasing distance from the reference layers. The portions of the thermal layer 240 closest to the coupling layers 234 and 236 (and thus to the reference layers that are not shown in FIG. 10A) have higher magnetic ordering temperature(s) than portions of the thermal layer 240. The portions of the thermal layer 240 closer to the reference layers remain ordered while regions further from the reference layers may be disordered. FIGS. 10B, 10C and 10D depicts embodiments of graphs 250, 250' and 250", respectively, of magnetic ordering temperature versus distance to the reference layer closest to the CoFeB layer 232. Note that the graphs terminate slightly above the magnetic ordering temperature axis because there is some space between the thermal layer and the reference layers. For example, a nonmagnetic spacer layer and, in the free layer 230, layers 202 and 204 between the thermal layer 240 and the reference layer. Although this may not be seen in FIGS. 10B, 10C and 10D, the graphs 250, 250' and 250", also terminate before the distance corresponding to the second reference layer (the distance between the two reference layers). As can be seen in the graphs 250, 250' and 250", the details of the variation in magnetic ordering temperature with distance from the reference layer scan vary. However, the general trend is the same in that the magnetic ordering temperature increases with decreasing distance to the reference layers. Thus, the minimum (or minima) in the magnetic ordering temperature occurs at or near the intermediate/central region of the thermal layer 240. The magnetic ordering temperature increases from the central region, region relative maxima near the interfaces between the thermal layer 240 and the coupling layers 234 and 236.

The variation of magnetic ordering temperature within the thermal layer 240 may be controlled by configuring various parameters of the thermal layer 240 in a manner similar to that discussed above. For example, one or more of a gradient in the Curie temperature of the thermal layer 240; a variation in the critical temperature of a magnetic exchange coupling between portions of the thermal layer 240 and/or between the thermal layer 240 and another layer such as the CoFeB layer(s) 232 and/or 238; a gradient in the saturation magnetization of the thermal layer 240; a gradient in the anisotropy particularly a perpendicular anisotropy gradient for the thermal layer 240; a variation in the product of the saturation magnetization and a thickness of a corresponding portion of the thermal layer 240; a gradient in a product of a perpendicular anisotropy constant and thickness; a gradient in the exchange current density over a particular temperature range; and/or a gradient in the stray magnetic field may result in a gradient in the magnetic ordering temperature. Any of the above parameters, separately or in any combination, may be used to configure the thermal layer 240 to have a gradient in the magnetic ordering temperature such that portions of the thermal layer 240 closer to the reference layers and layers 232 and 238 have a higher magnetic ordering temperature. The desired gradient in magnetic ordering temperature, as well as the parameters described above, may be achieved in an analogous manner to that used for the free layer 130. Thus, the magnetic ordering temperature may be configured by controlling the structure of the thermal layer 240.

The free layer 230 is programmed and read in an analogous manner to the free layers 130 and 130'. During writing using a current driven through the magnetic junction, the temperature of the free layer 230 increases. This may be due to the write current used and/or an additional source of heat such as a heater. The thermal layer 240 becomes magnetically disordered (in order from the regions furthest from the reference layers to the regions closest to the reference layers). In addition, spin transfer from a polarized spin current due to the reference layer may be used to switch the CoFeB layers 232/238. The write current and/or additional source of heat may be removed or reduced. The thermal layer 240 cools and becomes magnetically ordered starting with the regions closest to the reference layer/CoFeB layers 232/238 ending near the central region. The regions of the thermal layer 240 closest to the CoFeB layer 232 are magnetically coupled to and aligned with the magnetic moment of the CoFeB layer 232. Thus, the magnetic moment of the free layer 230 may be reliably switched to the desired direction. The gradient in magnetic ordering temperature is set such that all of the ordering temperatures are above temperatures expected to be reached during a read operation, allowing the free layer 230 to remain magnetically ordered during a read operation. Thus, a read operation generally does not disturb the state of the free layer 230.

A magnetic junction using the free layer 230 shares the benefits of the magnetic junction 100, 100', 100" and 100'". The free layer 230 may be switched using spin transfer torque. Thus, a more localized physical phenomenon may be used to write to the free layer 230. The thermal properties of the thermal layer 240 may also be configured for more reliable switching. Because higher temperature switching may be used, the write current may be reduced and/or switching may be performed more rapidly. Thus, the free layer 230 may have improved performance.

Figure 11:
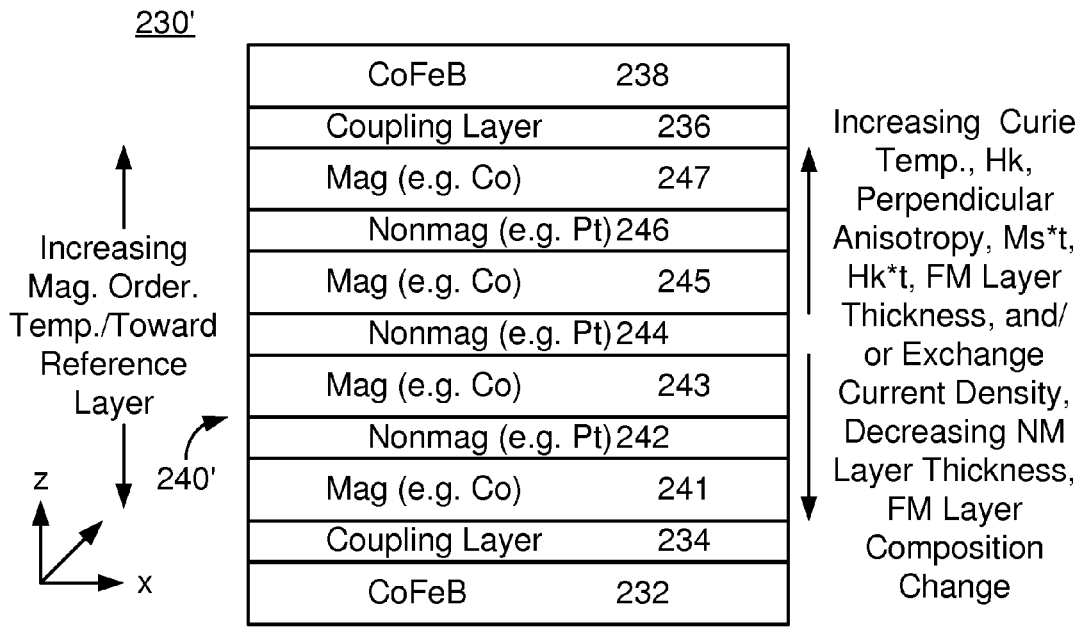
FIG. 11 depicts another exemplary embodiment of a free layer having a gradient in the magnetic ordering temperature.

FIG. 11 depicts an exemplary embodiment of a free layer 230' usable in a magnetic junction such as the magnetic junction 100' and/or 100'". For clarity, FIG. 11 is not to scale. The free layer 230' is analogous to the free layer 230. The free layer 230' is configured to be switched between stable magnetic states when a write current is passed through the magnetic junction 100' or 100'". Thus, the free layer 230' is switchable utilizing spin transfer torque. The free layer 230' includes CoFeB layers 232 and 238, coupling layers 234 and 236, and a thermal layer 240' that are analogous to the CoFeB layers 232 and 238, the coupling layers 234 and 236, and the thermal layer 240, respectively. The structure and function of the layers 232, 234, 236, 238 and 240' are thus analogous to that of the layers 232, 234, 236, 238 and 240, respectively.

The thermal layer 240' has a gradient in magnetic ordering temperature such that the magnetic ordering temperature decreases with increasing distance from the reference layers/CoFeB layers 232 and 238. The thermal layer 240' includes magnetic layers 241, 243, 245 and 247 interleaved with nonmagnetic layers 242, 244 and 246. For example, the layer 241, 243, 245 and 247 may include Co, while the layers 242, 244 and 246 may include Pt. In another embodiment, a different number of layers and/or different material(s) may be used. The magnetic layers 241 and 247 have higher magnetic ordering temperature(s) than the layers 243 and 245. Note that the magnetic ordering temperature of the layer 241 need not be equal to the magnetic ordering temperature of the layer 247. Similarly, the magnetic ordering temperature of the layers 243 may not be the same as that of the magnetic layer 245. However, the magnetic ordering temperatures are set such that the magnetic layers 241 and 247 closest to the reference layers remain ordered while the central layers 243 and 245 further from the reference layer may be disordered. At a lower temperature, all of the layers 241, 243, 245 and 247 may be ordered.

The variation of magnetic ordering temperature within the thermal layer 210 may be controlled by configuring various parameters of the magnetic layers 241, 243, 245 and 247 and/or nonmagnetic layers 242, 244 and 246 in a manner similar to that discussed above. For example, one or more of a gradient in the Curie temperature of the magnetic layers 241, 243, 245 and 247; a variation in the critical temperature of a magnetic exchange coupling between magnetic layers 241, 243, 245 and 247 and/or between the magnetic layers 241, 243, 245 and 247 and another layer such as the CoFeB layer 232; a gradient in the saturation magnetization of the magnetic layers 241, 243, 245 and 247; a gradient in the anisotropy particularly a perpendicular anisotropy gradient for the magnetic layers 241, 243, 245 and 247; a variation in the product of the saturation magnetization and a thickness of a corresponding portion of the magnetic layers 241, 243, 245 and 247; a gradient in a product of a perpendicular anisotropy constant and thickness for each of the magnetic layers 241, 243, 245 and 247; a gradient in the exchange current density for the magnetic layers 241, 243, 245 and 247 over a particular temperature range; and/or a gradient in the stray magnetic field at the magnetic layers 241, 243, 245 and 247 may result in a gradient in the magnetic ordering temperature. Any of the above parameters, separately or in any combination, may be used to configure the thermal layer 230' to have a gradient in the magnetic ordering temperature such that the magnetic ordering temperatures occur, from highest to lowest, for magnetic layers 241/247 and 243/245.

The desired gradient in magnetic ordering temperature, as well as the parameters described above, may be achieved in an analogous manner to that used for the free layer 130'. For example, each of the magnetic layers 241, 243, 245 and 247 may include $Co_mFe_{1-m}$ and each of the nonmagnetic layer(s) may include $Pd_nPt_{1-n}$, where m is not less than zero and not greater than one and where n is not less than zero and not greater than one. In such an embodiment, m and/or n may vary within a layer and/or between layers to provide the highest magnetic ordering temperature(s) at the top and bottom edges of the thermal layer 240'. In some such embodiments, m may also vary within the layer. As a result, the magnetic ordering temperatures of the magnetic layers 241, 243, 245 and 247 decrease with increasing distance from the reference layers. In another embodiment each of the magnetic layers 241, 243, 245 and 247 may include $Co_pFe_qZ_{1-p-q}$ and each of the nonmagnetic layer(s) may include W, where p is not less than zero and not greater than one and where q is not less than zero and not greater than one. In such an embodiment, p and/or q may vary within a layer and/or between layers to provide the desired magnetic ordering temperature gradient. In another embodiment, each of the magnetic layers 241, 243, 245 and 247 may include $Co_rFe_sZ_{1-r-s}$ and each of the nonmagnetic layer(s) 242, 244 and 246 may include Ta, where r is not less than zero and not greater than one and where s is not less than zero and not greater than one. In such an embodiment, r and/or s may vary within a layer and/or between layers to provide the desired magnetic ordering temperature gradient. In another embodiment each of the magnetic layers 241, 243, 245 and 247 may include $Co_tFe_uZ_{1-t-u}$ and each of the nonmagnetic layer(s) 242, 244, and 246 may include $Fe_vTa_{1-v}$, where t is not less than zero and not greater than one, u is not less than zero and not greater than one, v is not less than zero and not greater than one and Z includes at least one of B and Ga. In such an embodiment, t, u and/or v may vary within a layer and/or between layers to provide the desired magnetic ordering temperature gradient. In another embodiment, each of the magnetic layers 241, 243, 245 and 247 may include $Co_wFe_xB_{1-w-x}$ and each of the nonmagnetic layers 242, 244 and 246 may include MgO, where w is not less than zero and not greater than one and where x is not less than zero and not greater than one. In such an embodiment, w and/or x may vary within a layer and/or between layers to provide the desired magnetic ordering temperature gradient. In another embodiment, some combination of the above may be used.

The free layer 230' is programmed and read in an analogous manner to the free layers 130, 130' and 240. During writing using a current driven through the magnetic junction, the temperature of the free layer 230' increases. The magnetic layers 243/245 become magnetically before the magnetic layers 241/247. During programming, all of the layers 241, 243, 245 and 247 may become magnetically disordered. The CoFeB layers 232 and 238 have magnetic ordering temperature(s) above those reached by the free layer 230' during operation. Spin transfer from a polarized spin current due to the reference layer may be used to switch the CoFeB layers 232 and 238. The write current and/or additional source of heat may be removed or reduced. The magnetic layers 241/247 and 243/245 cool and become magnetically ordered in order. Because they are closer to the CoFeB layers 232 and 238, the magnetic moments of the magnetic layers 241 and 247 are aligned with the magnetic moments of the CoFeB layers 232 and 238, respectively. The magnetic layers 243 and 245 also transition to magnetically ordered and have magnetic moments that are aligned with those of the magnetic layers 241 and 247. Thus, the magnetic moment of the free layer 230' may be reliably switched to the desired direction. The gradient in magnetic ordering temperature is set such that the free layer 230' remains magnetically ordered during a read operation. Thus, a read operation generally does not disturb the state of the free layer 230'.

A magnetic junction using the free layer 230' shares the benefits of the magnetic junction 100, 100', 100'' and 100'''. Thus, the free layer 230' may have improved performance.

Figure 12:
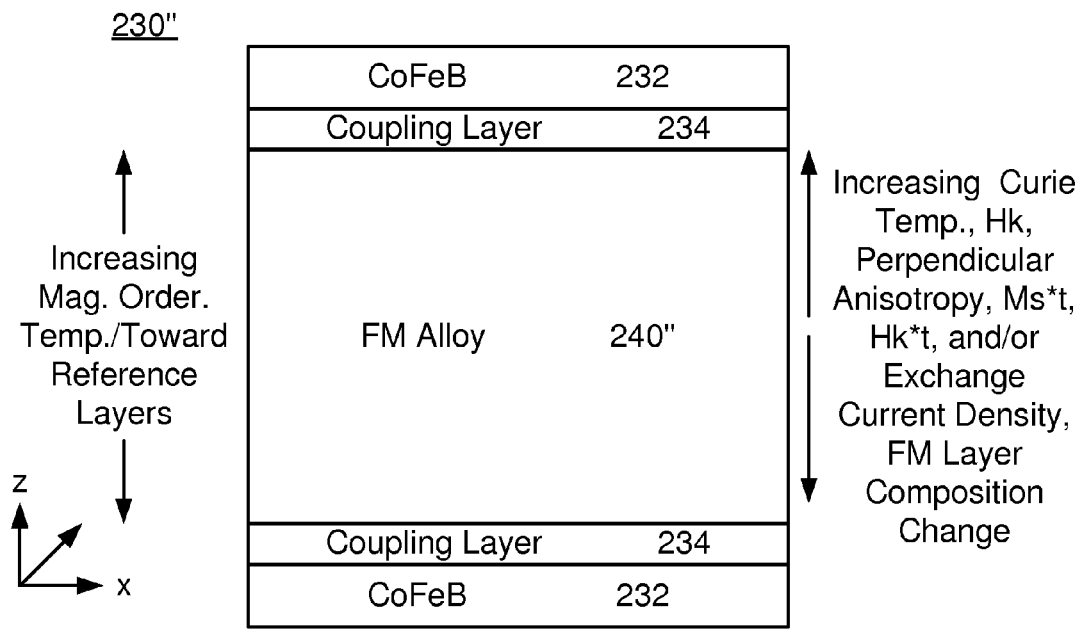
FIG. 12 depicts another exemplary embodiment of a free layer having a gradient in the magnetic ordering temperature.

FIG. 12 depicts an exemplary embodiment of a free layer 230'' usable in a magnetic junction such as the magnetic junction 100' and/or 100'''. For clarity, FIG. 12 is not to scale. The free layer 230'' is analogous to the free layers 230 and 230'. The free layer 230'' is configured to be switched between stable magnetic states when a write current is passed through the magnetic junction 100' or 100'''. Thus, the free layer 230'' is switchable utilizing spin transfer torque. The free layer 230'' includes CoFeB layers 232 and 238, coupling layers 234 and 236 and a thermal layer 240'' that are analogous to the CoFeB layers 232 and 238, the coupling layers 234 and 236 and the thermal layer 240/240', respectively. The structure and function of the layers 232, 234, 236, 238 and 240'' are thus analogous to that of the layers 232, 234, 236, 238 and 240, respectively.

The thermal layer 240'' has a gradient in magnetic ordering temperature such that the magnetic ordering temperature decreases with increasing distance from the reference layers/CoFeB layers 232 and 236. The thermal layer 240'' is a single magnetic alloy layer that has a varying magnetic ordering temperature. The variation of magnetic ordering temperature within the thermal layer 240'' may be controlled by configuring various parameters of the magnetic layer 2140'' in a manner similar to that discussed above. For example, one or more of a gradient in the Curie temperature of the magnetic layer 240''; a variation in the critical temperature of a magnetic exchange coupling between the magnetic layer 240'' and another layer such as the CoFeB layer(s) 232 and/or 238; a gradient in the saturation magnetization of the magnetic layer 240''; a gradient in the anisotropy particularly a perpendicular anisotropy gradient for the magnetic layer 240''; a variation in the product of the saturation magnetization and a thickness of a corresponding portion of the magnetic layer 240''; a gradient in a product of a perpendicular anisotropy constant and thickness for each of the magnetic layer 240''; a gradient in the exchange current density for the magnetic layer 240'' over a particular temperature range; and/or a gradient in the stray magnetic field at the magnetic layer 240'' may result in a gradient in the magnetic ordering temperature. Any of the above parameters, separately or in any combination, may be used to configure the thermal layer 240'' to have a gradient in the magnetic ordering temperature such that the magnetic ordering temperature of the magnetic layer 240'' decreases with increasing distance from the reference layer/CoFeB layers 232 and 238.

The desired gradient in magnetic ordering temperature, as well as the parameters described above, may be achieved in an analogous manner to that used for the free layer 130. The concentration of the magnetic element(s) and/or the constituents in the magnetic layer 240'' may be varied. For example, the magnetic layer 240'' may be a single layer formed of an alloy having a composition that varies with a distance from the reference layer. For example, the alloy may include $Co_xFe_yPd_zPt_{1-x-y-z}$, wherein x, y and z are each not less than zero and not greater than one and wherein at least one of x and y is greater than zero. In such a case, x, y and/or z may be varied such that the magnetic ordering temperature of the local region of the thermal layer 240'' decreases with increasing distance from the reference layers.

The free layer 230'' is programmed and read in an analogous manner to the free layers 130, 130', 240, and 240'. During writing using a current driven through the magnetic junction, the temperature of the free layer 230'' increases.

Regions of the magnetic layer 240" become magnetically disordered in order from closest to furthest from the CoFeB layers 232 and 238. Spin transfer from a polarized spin current due to the reference layer may be used to switch the CoFeB layers 232 and 238. The write current and/or additional source of heat may be removed or reduced. Portions of the magnetic layer 240" cool and become magnetically ordered in order from closest to furthest from the CoFeB layers 232 and 238. Thus, the magnetic moment of the free layer 230" may be reliably switched to the desired direction. The gradient in magnetic ordering temperature is set such that the free layer 230" remains magnetically ordered during a read operation. Thus, a read operation generally does not disturb the state of the free layer 230". A magnetic junction using the free layer 230" shares the benefits of the magnetic junction 100, 100', 100" and 100'''. Thus, the free layer 230" may have improved performance.

Figure 13:
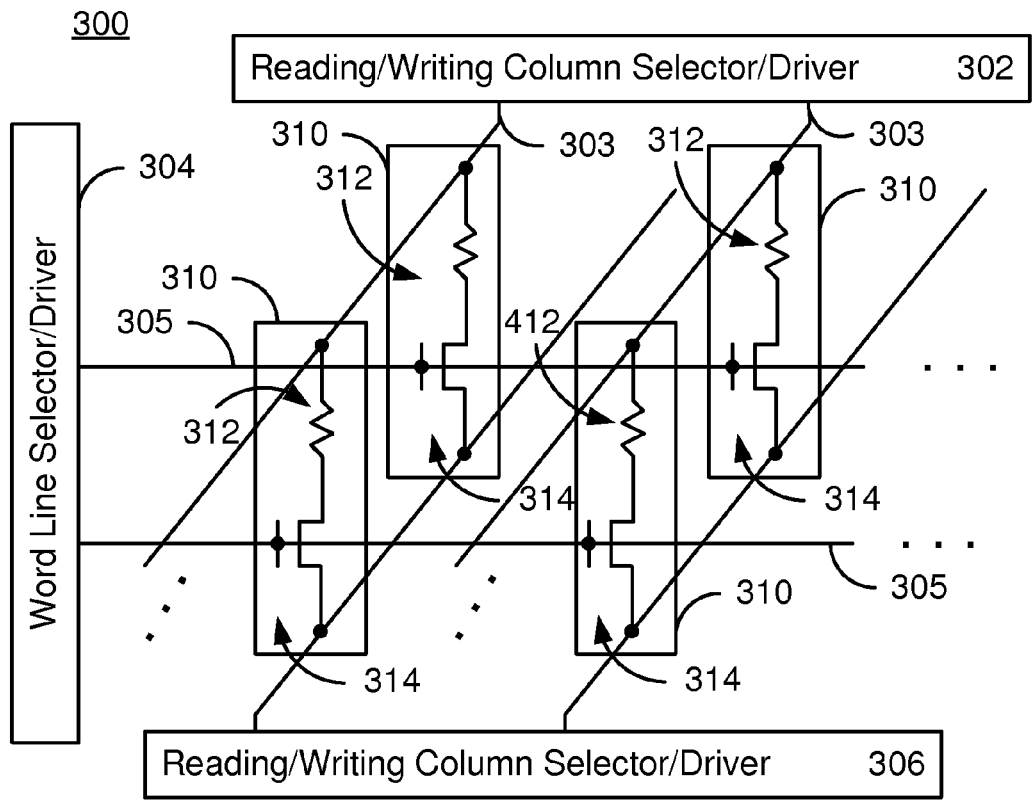
FIG. 13 depicts an exemplary embodiment of a memory utilizing magnetic junctions in the memory element(s) of the storage cell(s)
Figure 14:
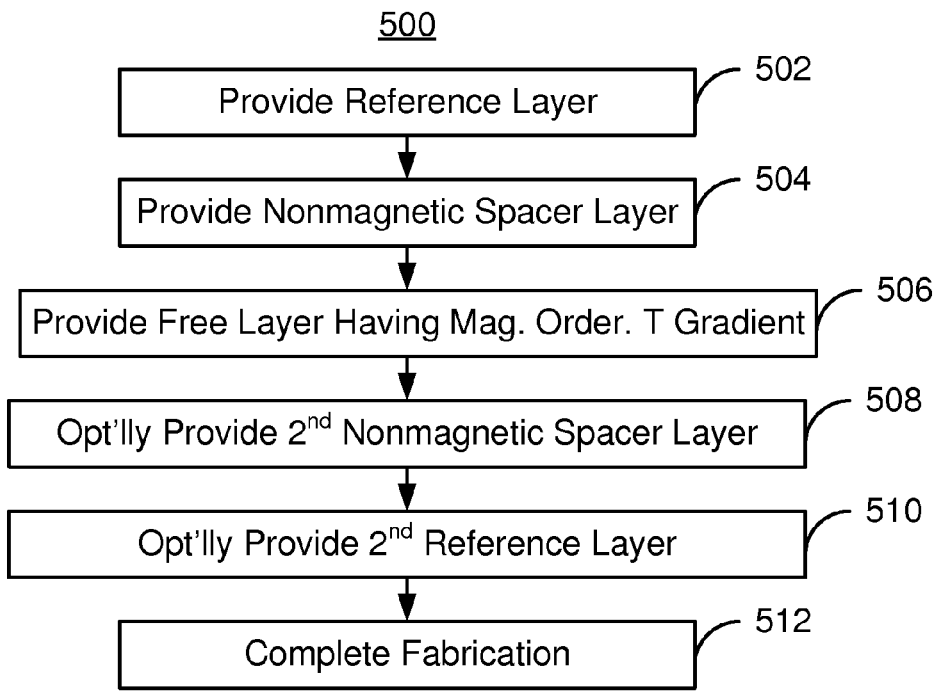
FIG. 14 depicts an exemplary embodiment of a method for providing a magnetic junction usable in an electronic device programmable using spin transfer torque and for which the free layer has a gradient in the magnetic ordering temperature.

FIG. 13 depicts an exemplary embodiment of a memory 300 that may use one or more of the magnetic junctions 100, 100', 100" and/or 100''' and the free layers 130, 130', 200, 200', 200", 230, 230' and/or 230". The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 100, 100', 100" and/or 100''' disclosed herein utilizing free layers 130, 120', 200, 200', 200", 230, 230' and/or 230". Thus, the free layer of the magnetic junctions 312 has a gradient in magnetic ordering temperature. Although one magnetic junction 312 is shown per cell 310, in other embodiments, another number of magnetic junctions 312 may be provided per cell. Further, although not shown, in some embodiments, the memory 300 may include heaters and associated electronics or some other mechanism used to heat the magnetic junctions 312. Elevated temperatures of the magnetic junctions 312 during programming allow for operation as discussed above. As such, the magnetic memory 300 may enjoy the benefits described above.

FIG. 16 depicts an exemplary embodiment of a method 500 for fabricating a magnetic junction. For simplicity, some steps may be omitted or combined. The method 500 is described in the context of the magnetic junctions 100, 100', 100" and 100'''. However, the method 500 may be used on other magnetic junctions. Further, the method 500 may be incorporated into fabrication of magnetic memories. Thus the method 500 may be used in manufacturing a STT-MRAM or other magnetic memory.

The reference layer 110/110' that may be a SAF is provided, via step 502. Step 502 may include depositing the desired materials at the desired thickness of the reference layer 110/110'. The nonmagnetic layer 120 is provided, via step 504. Step 504 may include depositing the desired nonmagnetic materials. In addition, the desired thickness of material may be deposited in step 504. The free layer 130/130'/200/200'/200"/230/230'/230" is provided, via step 506. Step 506 thus includes depositing the material(s) which result in a gradient in the magnetic ordering temperature for the free layer. The nonmagnetic layer 140 may optionally be provided, via step 508. The desired reference layer 150/150' may optionally be provided, via step 510. Fabricating of the magnetic junction 100, 100', 100" and/or 100''' may then be completed, via step 512. Consequently, the benefits of the magnetic junction(s) 100, 100', 100" and/or 100''' as well as the benefits of the free layers 130, 130', 200, 200', 200", 230, 230' and/or 230" may be achieved.

A method and system for providing a magnetic junction and an electronic device, such as one including a memory fabricated using the magnetic junction, has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
   a reference layer;
   a nonmagnetic spacer layer; and
   a free layer, the nonmagnetic spacer layer being between the free layer and the reference layer, the free layer having a gradient in a magnetic ordering temperature such that a first portion of the free layer has a first magnetic ordering temperature higher than a second magnetic ordering temperature of a second portion of the free layer and such that the second portion of the free layer has the second magnetic ordering temperature higher than a third magnetic ordering temperature of a third portion of the free layer, the first portion of the free layer being closer to the reference layer than the second portion of the free layer, the second portion of the free layer being closer to the reference layer than the third portion of the free layer, the gradient being such that the magnetic ordering temperature decreases with increasing distance from the reference layer, the first portion of the free layer transitioning from a first magnetically disordered state to a first magnetically ordered state at the first magnetic ordering temperature, the second portion of the free layer transitioning from a second magnetically disordered state to a second magnetically ordered state at the second magnetic ordering temperature, the third portion of the free layer transitioning from a third magnetically disordered state to a third magnetically ordered state at the third magnetic ordering temperature; wherein the gradient in the magnetic ordering temperature corresponds to at least one of an exchange coupling critical temperature gradient, a saturation magnetization ($M_s$) gradient, an anisotropy (Hk) gradient, a perpendicular anisotropy gradient, a first gradient in a first product of the saturation magnetization and a thickness of a corresponding portion of the free layer, a second gradient in a second product of a perpendicular anisotropy constant and the thickness, an exchange current density gradient over a particular temperature range and a stray field gradient; and wherein the first portion, the second portion and the third portion of the free layer are exchange coupled to all switch together such that all of the free layer is switchable between a plurality of stable magnetic states when a write current is passed through the magnetic junction, the first magnetic ordering temperature and the third magnetic ordering temperature being such that the write current causes at least the third portion of the free layer to become magnetically disordered and the first portion of the free layer to remain magnetically ordered during switching.

2. The magnetic junction of claim 1 wherein the gradient in the magnetic ordering temperature is such that the magnetic ordering temperature of the free layer decreases with increasing distance from the reference layer.

3. The magnetic junction of claim 2 wherein the free layer includes an alloy having a composition that varies with a distance from the reference layer.

4. The magnetic junction of claim 3 wherein the alloy includes $Co_xFe_yPd_zPt_{1-x-y-z}$, wherein x, y and z are each not less than zero and not greater than one and wherein at least one of x and y is greater than zero.

5. The magnetic junction of claim 1 wherein the free layer includes a plurality of magnetic layers, a first layer of the plurality of magnetic layers corresponding to the first portion of the free layer, a second layer of the plurality of magnetic layers corresponding to the second portion of the free layer, the second layer being further from the reference layer than the first layer.

6. The magnetic junction of claim 5 wherein each of the plurality of magnetic layers has a corresponding magnetic ordering temperature such that first layer becomes magnetically ordered at a higher temperature than the second layer and the plurality of magnetic layers are ferromagnetically coupled such that the plurality of magnetic layers are switched by the write current.

7. The magnetic junction of claim 5 wherein the plurality of magnetic layers are interleaved with a plurality of nonmagnetic layers.

8. The magnetic junction of claim 7 wherein at least one of each of the plurality of magnetic layers includes an alloy selected from $Co_mFe_{1-m}$, $Ni_mFe_{1-m}$, $Co_mNi_{1-m}$, $Mn_mFe_{1-m}$, $Mn_mCo_{1-m}$ and $Mn_mNi_{1-m}$ and each of the plurality of nonmagnetic layers includes $Pd_nPt_{1-n}$, the each of the plurality of magnetic layers includes $Co_pFe_qZ_{1-p-q}$, each of the plurality of nonmagnetic layers includes a material selected from W, Ta, Zr, Hf, Mo, Bi, Nb, Al, Ga and Ge, each of the plurality of magnetic layers includes $Co_rFe_sZ_{1-r-s}$ and each of the plurality of nonmagnetic layers includes Ta, each of the plurality of magnetic layers includes $Co_tFe_uZ_{1-t-u}$ and each of the plurality of nonmagnetic layers includes $Fe_vX_{1-v}$, each of the plurality of magnetic layers includes $Co_wFe_xB_{1-w-x}$ and each of the plurality of nonmagnetic layers includes MgO; and
   wherein m is not less than zero and not greater than 1, n is not less than zero and not greater than one, p is not less than zero and not greater than 1, q is not less than zero and not greater than one, r is not less than zero and not greater than 1, s is not less than zero and not greater than one, t is not less than zero and not greater than one, u is not less than zero and not greater than one, v is not less than zero and not greater than one, wherein w is not less than zero and not greater than 1, x is not less than zero and not greater than one, X includes at least one of W, Ta, Zr, Hf, Mo, Bi, Nb, Al, Ga, and Ge, and Z includes at least one of B, W, Ta, Ge, Zr, Hf, Mo, Nb, Al and Ga.

9. The magnetic junction of claim 8 wherein the gradient in the magnetic ordering temperature is configured using at least one of varying at least one of m, n, p, q, r, s, t, u, v, w and x with distance from the reference layer, varying a thickness of each of the plurality of magnetic layers with the distance from the reference layer and varying a nonmagnetic layer thickness of each of the plurality off nonmagnetic layers with the distance from the reference layer.

10. The magnetic junction of claim 1 further comprising:
   an additional nonmagnetic spacer layer, the free layer being between the nonmagnetic spacer layer and the additional spacer layer; and
   an additional reference layer, the additional spacer layer being between the additional reference layer and the free layer and wherein the gradient in the magnetic ordering temperature of the free layer is configured such that a third portion of the free layer has a third magnetic ordering temperature greater than the second magnetic ordering temperature, the third portion being between the second portion of the free layer and the additional spacer layer.

11. The magnetic junction of claim 10 wherein the gradient in the magnetic ordering temperature is such that the magnetic ordering temperature of the free layer decreases with increasing distance from the reference layer to an intermediate region off the free layer and increases with increasing distance from the reference layer between the intermediate region of the free layer and the additional reference layer.

12. An electronic device comprising:
   a magnetic memory including a plurality of magnetic storage cells and a plurality of bit lines, each of the plurality of magnetic storage cells including at least one magnetic junction, the at least one magnetic junction including a reference layer, a nonmagnetic spacer layer, and a free layer, the nonmagnetic spacer layer being between the free layer and the reference layer, the free layer having a gradient in a magnetic ordering temperature such that a first portion of the free layer has a first magnetic ordering temperature higher than a second magnetic ordering temperature of a second portion of the free layer and such that the second portion of the free layer has the second magnetic ordering temperature higher than a third magnetic ordering temperature of a third portion of the free layer, the first portion of the free layer being closer to the reference layer than the second portion of the free layer, the second portion of the free layer being closer to the reference layer than the third portion of the free layer, the first portion of the free layer transitioning from a first magnetically disordered state to a first magnetically ordered state at the first magnetic ordering temperature, the second portion of the free layer transitioning from a second magnetically disordered state to a second magnetically ordered state at the second magnetic ordering temperature, the third portion of the free layer transitioning from a third magnetically disordered state to a third magnetically ordered state at the third magnetic ordering temperature, the gradient being such that the magnetic ordering temperature decreases with increasing distance from the reference layer, the first portion, the second portion and the third portion of the free layer being exchange coupled to all switch together such that all of the free layer is switchable between a plurality of stable magnetic states when a write current is passed through the magnetic junction, the first magnetic ordering temperature and the third magnetic ordering temperature being such that the write current causes at least the third portion of the free layer to become magnetically disordered and the first portion of the free layer to remain magnetically ordered during switching; wherein the gradient in the magnetic ordering temperature corresponds to at least one of an exchange coupling critical temperature gradient, a saturation magnetization ($M_s$) gradient, an anisotropy (Hk) gradient, a perpendicular anisotropy gradient, a first gradient in a first product of the saturation magnetization and a thickness of a corresponding portion of the free layer, a second gradient in a second product of a perpendicular anisotropy constant and the thickness, an exchange current density gradient over a particular temperature range and a stray field gradient.

13. The electronic device of claim 12 wherein the gradient in the magnetic ordering temperature is such that the magnetic ordering temperature of the free layer decreases with increasing distance from the reference layer.

14. The electronic device of claim 12 wherein the at least one magnetic junction further includes:
an additional nonmagnetic spacer layer, the free layer being between the nonmagnetic spacer layer and the additional spacer layer; and
an additional reference layer, the additional spacer layer being between the additional reference layer and the free layer and wherein the gradient in the magnetic ordering temperature of the free layer is configured such that a third portion of the free layer has a third magnetic ordering temperature greater than the second magnetic ordering temperature, the third portion being between the second portion of the free layer and the additional spacer layer.

15. The electronic device of claim 14 wherein the gradient in the magnetic ordering temperature is such that the magnetic ordering temperature of the free layer decreases with increasing distance from the reference layer to an intermediate region off the free layer and increases with increasing distance from the reference layer between the intermediate region of the free layer and the additional reference layer.

16. A method for providing a magnetic junction for use in a magnetic device comprising:
providing a reference layer;
providing a nonmagnetic spacer layer on the reference layer; and
providing a free layer on the nonmagnetic spacer layer, the free layer having a gradient in a magnetic ordering temperature such that a first portion of the free layer has a first magnetic ordering temperature higher than a second magnetic ordering temperature of a second portion of the free layer and such that the second portion of the free layer has the second magnetic ordering temperature higher than a third magnetic ordering temperature of a third portion of the free layer, the first portion of the free layer being closer to the reference layer than the second portion of the free layer, the second portion of the free layer being closer to the reference layer than the third portion of the free layer, the first portion of the free layer transitioning from a first magnetically disordered state to a first magnetically ordered state at the first magnetic ordering temperature, the second portion of the free layer transitioning from a second magnetically disordered state to a second magnetically ordered state at the second magnetic ordering temperature, the third portion of the free layer transitioning from a third magnetically disordered state to a third magnetically ordered state at the third magnetic ordering temperature, the gradient being such that the magnetic ordering temperature decreases with increasing distance from the reference layer, the first portion, the second portion and the third portion of the free layer being exchange coupled to switch together such that all of the free layer is switchable between a plurality of stable magnetic states when a write current is passed through the magnetic junction, the gradient in the magnetic ordering temperature corresponding to at least one of an exchange coupling critical temperature gradient, a saturation magnetization ($M_s$) gradient, an anisotropy (Hk) gradient, a perpendicular anisotropy gradient, a first gradient in a first product of the saturation magnetization and a thickness of a corresponding portion of the free layer, a second gradient in a second product of a perpendicular anisotropy constant and the thickness, an exchange current density gradient over a particular temperature range and a stray field gradient; and wherein the first magnetic ordering temperature and the third magnetic ordering temperature are such that the write current causes at least the third portion of the free layer to become magnetically disordered and the first portion of the free layer to remain magnetically ordered during switching.

17. The method of claim 16 wherein the gradient in the magnetic ordering temperature is such that the magnetic ordering temperature of the free layer decreases with increasing distance from the reference layer.

18. The method of claim 16 wherein the free layer includes a plurality of magnetic layers interleaved with a plurality of nonmagnetic layers, a first layer of the plurality of magnetic layers corresponding to the first portion of the free layer, a second layer of the plurality of magnetic layers corresponding to the second portion of the free layer, the second layer being further from the reference than the first layer, the plurality of magnetic layers being ferromagnetically coupled such that the plurality of magnetic layers are switched by the write current.

19. The method of claim 18 wherein at least one of each of the plurality of magnetic layers includes an alloy selected from $Co_mFe_{1-m}$, $Ni_mFe_{1-m}$, $Co_mNi_{1-m}$, $Mn_mFe_{1-m}$, $Mn_mCo_{1-m}$ and $Mn_mNi_{1-m}$ and each of the plurality of nonmagnetic layers includes $Pd_nPt_{1-n}$, the each of the plurality of magnetic layers includes $Co_pFe_qZ_{1-p-q}$, each of the plurality of nonmagnetic layers includes a material selected from W, Ta, Zr, Hf, Mo, Bi, Nb, Al, Ga and Ge, each of the plurality of magnetic layers includes $Co_rFe_sZ_{1-r-s}$ and each of the plurality of nonmagnetic layers includes Ta, each of the plurality of magnetic layers includes $Co_tFe_uZ_{1-t-u}$ and each of the plurality of nonmagnetic layers includes $Fe_vX_{1-v}$, each of the plurality of magnetic layers includes $Co_wFe_xB_{1-w-x}$ and each of the plurality of nonmagnetic layers includes MgO; and
wherein m is not less than zero and not greater than 1, n is not less than zero and not greater than one, p is not less than zero and not greater than 1, q is not less than zero and not greater than one, r is not less than zero and not greater than 1, s is not less than zero and not greater than one, t is not less than zero and not greater than one, u is not less than zero and not greater than one, v is not less than zero and not greater than one, wherein w is not less than zero and not greater than 1, x is not less than zero and not greater than one, X includes at least one of W, Ta, Zr, Hf, Mo, Bi, Nb, Al, Ga, and Ge, and Z includes at least one of B, W, Ta, Ge, Zr, Hf, Mo, Nb, Al and Ga.

20. The method of claim 19 wherein the free layer includes an alloy having a composition that varies with a distance from the reference layer.

21. The method of claim 16 further comprising:
providing an additional nonmagnetic spacer layer, the free layer being between the nonmagnetic spacer layer and the additional spacer layer; and
providing an additional reference layer, the additional spacer layer being between the additional reference layer and the free layer and wherein the gradient in the magnetic ordering temperature of the free layer is configured such that a third portion of the free layer has a third magnetic ordering temperature greater than the second magnetic ordering temperature, the third portion being between the second portion of the free layer and the additional spacer layer.

22. The method of claim 21 wherein the gradient in the magnetic ordering temperature is such that the magnetic ordering temperature of the free layer decreases with increasing distance from the reference layer to an intermediate region off the free layer and increases with increasing distance from the reference layer between the intermediate region of the free layer and the additional reference layer.

\* \* \* \* \*